(12) United States Patent
Ka et al.

(10) Patent No.: US 10,879,333 B2
(45) Date of Patent: Dec. 29, 2020

(54) ORGANIC LIGHT EMITTING DISPLAY DEVICE

(71) Applicant: SAMSUNG DISPLAY CO., LTD., Yongin-si (KR)

(72) Inventors: Ji Hyun Ka, Yongin-si (KR); Tae Hoon Kwon, Yongin-si (KR); Yang Wan Kim, Yongin-si (KR); Min Ku Lee, Yongin-si (KR); Jae Yong Lee, Yongin-si (KR); Jin Tae Jeong, Yongin-si (KR); Seung Ji Cha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 189 days.

(21) Appl. No.: 15/890,674

(22) Filed: Feb. 7, 2018

(65) Prior Publication Data

US 2018/0226467 A1 Aug. 9, 2018

(30) Foreign Application Priority Data

Feb. 7, 2017 (KR) .................. KR10-2017-0016800

(51) Int. Cl.
*H01L 27/32* (2006.01)
*H01L 51/52* (2006.01)
(Continued)

(52) U.S. Cl.
CPC .......... *H01L 27/3276* (2013.01); *H01L 22/34* (2013.01); *H01L 27/3244* (2013.01);
(Continued)

(58) Field of Classification Search
CPC ............. H01L 27/3276; H01L 51/5203; H01L 51/0031; H01L 22/34; H01L 27/3244; G09G 2310/0264
See application file for complete search history.

(56) References Cited

U.S. PATENT DOCUMENTS

| | | | |
|---|---|---|---|
| 2010/0201661 A1* | 8/2010 | Kimura | G02F 1/1368 345/205 |
| 2010/0213482 A1* | 8/2010 | Kim | H01L 27/3248 257/98 |

(Continued)

FOREIGN PATENT DOCUMENTS

KR 101101070 B1 12/2011

*Primary Examiner* — Amr A Awad
*Assistant Examiner* — Maheen I Javed
(74) *Attorney, Agent, or Firm* — Cantor Colburn LLP

(57) ABSTRACT

An organic light emitting display device includes a display unit including a first pixel column and a first data line connected to the first pixel column, a first pad unit including first and second signal pads, a test unit including a first switching element which is connected between the first data line and the first signal pad, and includes a control electrode connected to the second signal pad, a first conductive pattern provided in a different layer from that of the first signal pad and connected to the first signal pad, and a second conductive pattern provided in a different layer from that of the second signal pad and connected to the second signal pad, where the first and second conductive patterns are spaced apart from each other in the same layer, and a width of the first conductive pattern is greater than that of the second conductive pattern.

16 Claims, 13 Drawing Sheets

(51) Int. Cl.
*H01L 51/00* (2006.01)
*H01L 21/66* (2006.01)

(52) U.S. Cl.
CPC ...... *H01L 51/0031* (2013.01); *H01L 51/5203* (2013.01); *G09G 2310/0264* (2013.01)

(56) References Cited

U.S. PATENT DOCUMENTS

| | | | |
|---|---|---|---|
| 2011/0084955 A1 | 4/2011 | Kim | |
| 2014/0176844 A1* | 6/2014 | Yanagisawa | G02F 1/1309 349/43 |
| 2014/0292622 A1* | 10/2014 | Lee | G09G 3/3233 345/80 |
| 2018/0040640 A1* | 2/2018 | Takahashi | G09G 3/3233 |
| 2018/0124933 A1* | 5/2018 | Park | G09G 3/22 |

* cited by examiner

ORGANIC LIGHT EMITTING DISPLAY DEVICE

The application claims priority to Korean Patent Application No. 10-2017-0016800, filed on Feb. 7, 2017, and all the benefits accruing therefrom under 35 U.S.C. § 119, the content of which in its entirety is herein incorporated by reference.

BACKGROUND

1. Field

Exemplary embodiments of the invention relate to an organic light emitting display device.

2. Description of the Related Art

An organic light emitting display device is used to display an image using organic light emitting diodes ("OLEDs") that are self-luminescent elements, and has come into the spotlight as a next-generation display device because of its excellent luminance and color purity. Organic light emitting display devices go through several test operations in a manufacturing process thereof, and only products determined as good products in the manufacturing process are shipped. An array test and a cell test may be performed in the manufacturing process of panels of the organic light emitting display devices, and a module process may be performed on only panels determined as good products, for example.

SUMMARY

Exemplary embodiments provide an organic light emitting display device that includes a test unit for detecting a defect of a display unit in early stage and enables a test signal to be stably supplied thereto.

According to an exemplary embodiment of the invention, there is provided an organic light emitting display device including a display unit including a first pixel column and a first data line connected to the first pixel column, a first pad unit including a first signal pad and a second signal pad, a test unit including a first switching element connected between the first data line and the first signal pad, where a control electrode of the first switching element is connected to the second signal pad, a first conductive pattern provided in a different layer from that of the first signal pad to be connected to one end of the first signal pad, and a second conductive pattern provided in a different layer from that of the second signal pad to be connected to one end of the second signal pad, where the first conductive pattern and the second conductive pattern are provided to be spaced apart from each other in the same layer, and a width of the first conductive pattern is greater than that of the second conductive pattern.

In an exemplary embodiment, the organic light emitting display device may further include a dummy pad provided to be adjacent to the first signal pad in the same layer as that of the first signal pad. At least one region of the dummy pad may overlap with the first conductive pattern.

In an exemplary embodiment, the organic light emitting display device may further include at least one insulating layer interposed between the dummy pad and the first conductive pattern. The dummy pad may be insulated from the first conductive pattern.

In an exemplary embodiment, the first pixel column may include a plurality of pixels each including at least one transistor. The transistor may include an active pattern provided on a substrate, source and drain electrodes connected to the active pattern, and a gate electrode overlapping with the active pattern with a first insulating layer interposed therebetween, the gate electrode being provided in the same layer as that of the first and second conductive patterns.

In an exemplary embodiment, the organic light emitting display device may further include a source-drain pattern connected to at least one of the source and drain electrodes, the source-drain pattern being provided in the same layer as that of the first and second signal pads.

In an exemplary embodiment, the first and second signal pads may include the same material with each other, and the first and second conductive patterns may include the same material with each other.

In an exemplary embodiment, the first and second conductive patterns may include a different material from that of the first and second signal pads, and include a material having a higher corrosion resistance than that of the first and second signal pads.

In an exemplary embodiment, the first pixel column may include a plurality of first color pixels that emit light of a first color, and a plurality of second color pixels that emit light of a second color. The plurality of first color pixels and the plurality of second color pixels may be alternately arranged.

In an exemplary embodiment, the display unit may further include a second pixel column being adjacent to the first pixel column, the second pixel column including a plurality of third color pixels that emit light of a third color, and a second data line connected to the second pixel column.

In an exemplary embodiment, the first pad unit may further include third, fourth, fifth, and sixth signal pads provided in the same layer as that of the first and second signal pads. The test unit may further include a second switching element connected between the first data line and the third signal pad, the second switching element including a control electrode connected to the fourth signal pad, and a third switching element connected between the second data line and the fifth signal pad, the third switching element including a control electrode connected to the sixth signal pad.

In an exemplary embodiment, the organic light emitting display device may further include third, fourth, fifth, and sixth conductive patterns respectively connected to one ends of the third, fourth, fifth, and sixth signal pads, the third, fourth, fifth, and sixth conductive patterns being provided in the same layer as that of the first and second conductive patterns. A width of each of the first and third conductive patterns may be greater than that of each of the second, fourth, fifth, and sixth conductive patterns.

In an exemplary embodiment, the organic light emitting display device may further include a second pad unit including a plurality of electrically isolated pads that are provided in a vicinity of the first pad unit.

According to an exemplary embodiment of the invention, there is provided an organic light emitting display device including a display unit including a first pixel column and a first data line connected to the first pixel column, a first pad unit including a first signal pad and a second signal pad, a test unit including a first switching element connected between the first data line and the first signal pad, where a control electrode of the first switching element is connected to the second signal pad, a first conductive pattern provided in a different layer from that of the first signal pad to be connected to one end of the first signal pad, and a second conductive pattern provided in a different layer from that of the second signal pad to be connected to one end of the second signal pad, where the first conductive pattern and the second conductive pattern have different structures from each other.

In an exemplary embodiment, the first conductive pattern may have a multi-layer structure including a first sub-conductive pattern provided in the same layer as that of the second conductive pattern, and a second sub-conductive pattern provided in a different layer from that of the first sub-conductive pattern to be connected to the first sub-conductive pattern.

In an exemplary embodiment, the first pixel column may include a plurality of pixels each including at least one transistor and a capacitor. The capacitor may include a first electrode provided in the same layer as that of the first sub-conductive pattern, and a second electrode provided in the same layer as that of the second sub-conductive pattern.

In an exemplary embodiment, the transistor may include an active pattern provided on a substrate, source and drain electrodes connected to the active pattern, and a gate electrode overlapping with the active pattern with a first insulating layer interposed therebetween, the gate electrode being provided in the same layer as that of the first sub-conductive pattern.

In an exemplary embodiment, the organic light emitting display device may further include a source-drain pattern connected to at least one of the source and drain electrodes, the source-drain pattern being provided in the same layer as that of the first and second signal pads.

In an exemplary embodiment, the second conductive pattern may have a single-layer structure including one conductive layer provided in the same layer as that of the first sub-conductive pattern.

In an exemplary embodiment, the first and second conductive patterns may include a different material from that of the first and second signal pads, and include a material having a higher corrosion resistance than that of the first and second signal pads.

In an exemplary embodiment, the first pixel column may include a plurality of first color pixels that emit light of a first color, and a plurality of second color pixels that emit light of a second color. The plurality of first color pixels and the plurality of second color pixels may be alternately arranged.

In an exemplary embodiment, the display unit may further include a second pixel column being adjacent to the first pixel column, the second pixel column including a plurality of third color pixels that emit light of a third color, and a second data line connected to the second pixel column.

In an exemplary embodiment, the first pad unit may further include third, fourth, fifth, and sixth signal pads provided in the same layer as that of the first and second signal pads. The test unit may further include a second switching element connected between the first data line and the third signal pad, the second switching element including a control electrode connected to the fourth signal pad, and a third switching element connected between the second data line and the fifth signal pad, the third switching element including a control electrode connected to the sixth signal pad.

In an exemplary embodiment, the organic light emitting display device may further include third, fourth, fifth, and sixth signal pads respectively connected to one ends of the third, fourth, fifth, and sixth signal pads. The first and third conductive patterns may have the same structure with each other, and the second, fourth, fifth and sixth conductive patterns may have the same structure with one another and have a different structure from that of the first and third conductive patterns.

In an exemplary embodiment, the first and third conductive patterns may have a multi-layer structure, and the second, fourth, fifth, and sixth conductive patterns may have a single-layer structure.

In an exemplary embodiment, the organic light emitting display device may further include a second pad unit including a plurality of electrically isolated pads that are provided in the vicinity of the first pad unit.

BRIEF DESCRIPTION OF THE DRAWINGS

The above and other exemplary embodiments, advantages and features of this disclosure will now be described more fully hereinafter with reference to the accompanying drawings, in which.

DETAILED DESCRIPTION

Figure 1:
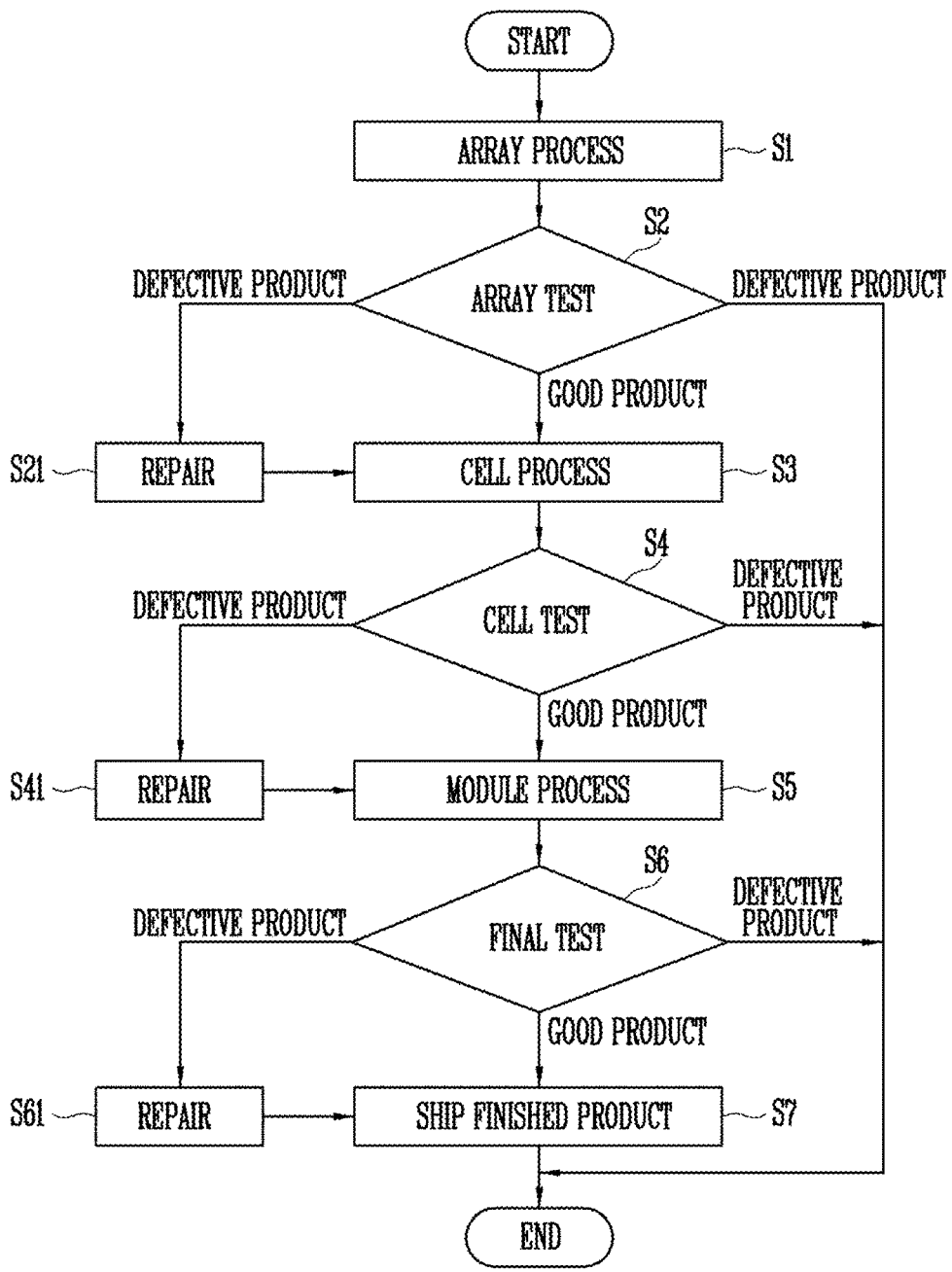
FIG. 1 sequentially illustrates an exemplary embodiment of a manufacturing method of an organic light emitting display device according to the invention.

Hereinafter, exemplary embodiments of the disclosure will be described in detail with reference to the accompanying drawings. However, the disclosure is not limited to the exemplary embodiments but may be implemented into different forms. These exemplary embodiments are provided only for illustrative purposes and for full understanding of the scope of the disclosure by those skilled in the art.

In the following exemplary embodiments and the attached drawings, elements not directly related to the disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 sequentially illustrates a manufacturing method of an organic light emitting display device according to an exemplary embodiment of the invention. An exemplary embodiment in which the organic light emitting device is manufactured through three test operations is disclosed in FIG. 1, but the invention is not limited thereto. In other exemplary embodiments, at least one test operation among the test operations shown in FIG. 1 may be omitted, or another test operation not shown in FIG. 1 may be added.

Referring to FIG. 1, an array process (S1) of forming a pixel circuit array on a substrate is first performed. In some exemplary embodiments, the array process (S1) may be performed on a mother substrate for manufacturing a plurality of panels at one time. In some exemplary embodiments, each pixel circuit may include two or more thin film transistors ("TFTs") and one or more capacitors, for example.

When the array process (S1) is completed, an array test (S2) for detecting whether the pixel circuit array is defective is performed. In the array test (S2), it is tested whether the TFT is normally operated. A pixel circuit determined as a defective product in the array test (S2) may go through a repair process (S21). Alternatively, when the pixel circuit is irreparable, processing of the pixel circuit does not proceed to a next process but is ended.

A cell process (S3) of forming an organic light emitting diode ("OLED") in each pixel region is performed on the pixel circuit array that is determined as a good product in the array test (S2) or completely repaired. In an exemplary embodiment, an OLED including a first electrode (e.g., an anode electrode), an organic emitting layer, and a second electrode (e.g., a cathode electrode), which is connected to each pixel circuit, may be formed in the cell process S3, for example.

When the cell process (S3) is completed, a cell test (S4) is performed. In an exemplary embodiment, the cell test (S4) may include a lighting test, a leakage current test, and/or an aging process on a panel, for example. In some exemplary embodiments, the cell test (S4) may be performed in units of panels individually separated through a primary scribing process. A panel determined as a defective product in the cell test (S4) may go through a repair process (S41). Alternatively, when the panel is irreparable, processing of the panel does not proceed to a next process but is ended.

A final test (S6) via a module process (S5) is performed on the panel that is determined as a good product in the cell test (S4) or completely repaired. Finished and defective products are finally sorted through the final test (S6). A module determined as a defective product in the final test (S6) may go through a repair process (S61). Alternatively, when the module is irreparable, processing of the panel is ended.

The module that is determined as a good product in the final test (S6) or completely repaired is shipped as a finished product (S7).

As described above, the manufacturing method of the organic light emitting display device according to the exemplary embodiment of the invention includes several test operations. Accordingly, defects occurring in a manufacturing process may be detected at early stage. A manufacturing yield is increased by repairing panels or modules in which defects occur. Alternatively, a subsequently process is not performed on irreparable panels or modules, but processing of the irreparable panels or modules is ended, thereby reducing waste of manufacturing time, cost, and the like. Accordingly, the manufacturing efficiency of the organic light emitting display device may be improved.

Figure 2:
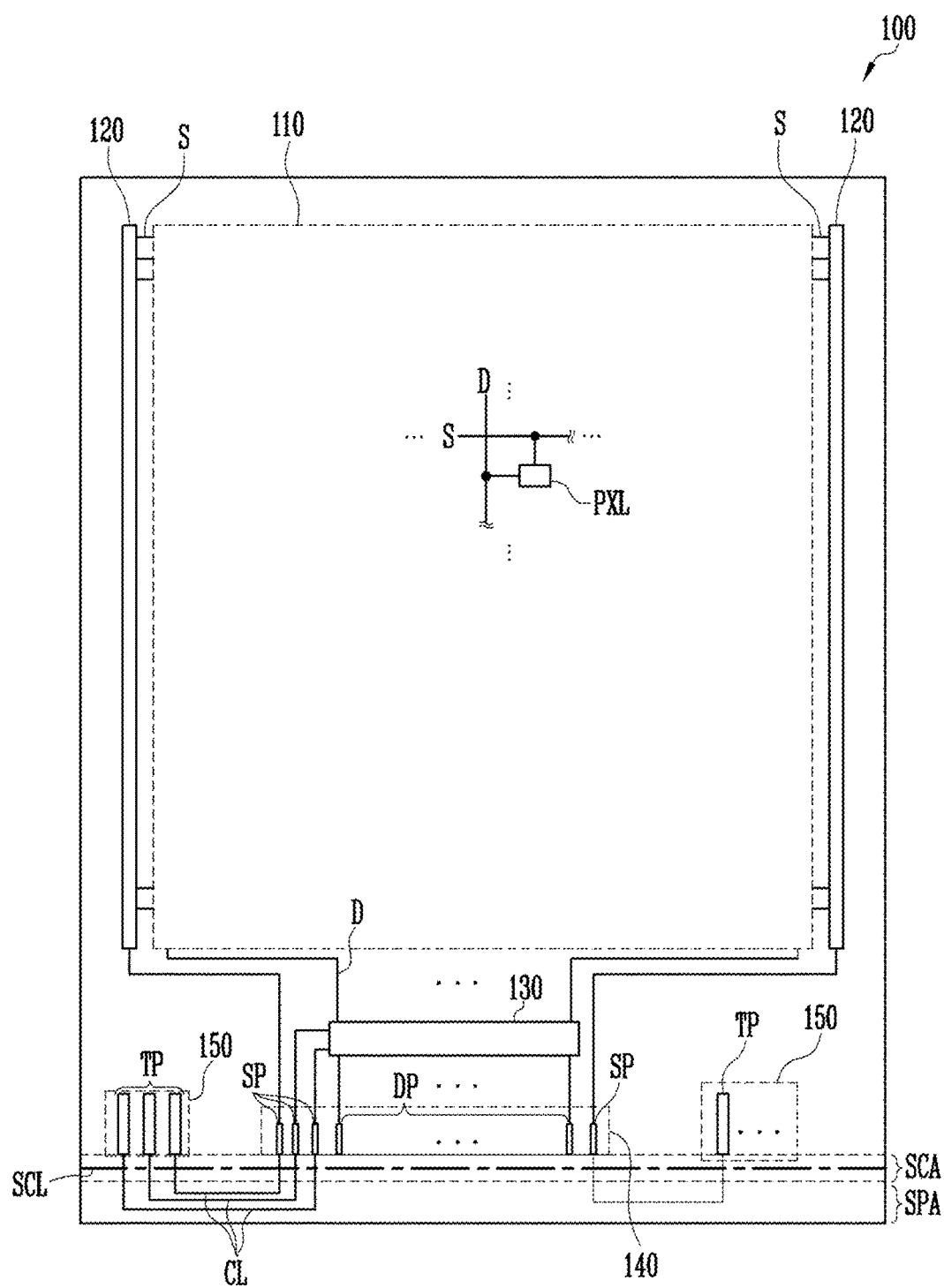
FIGS. 2 and 3 illustrate an exemplary embodiment of a panel of an organic light emitting display device according to the invention.
Figure 3:
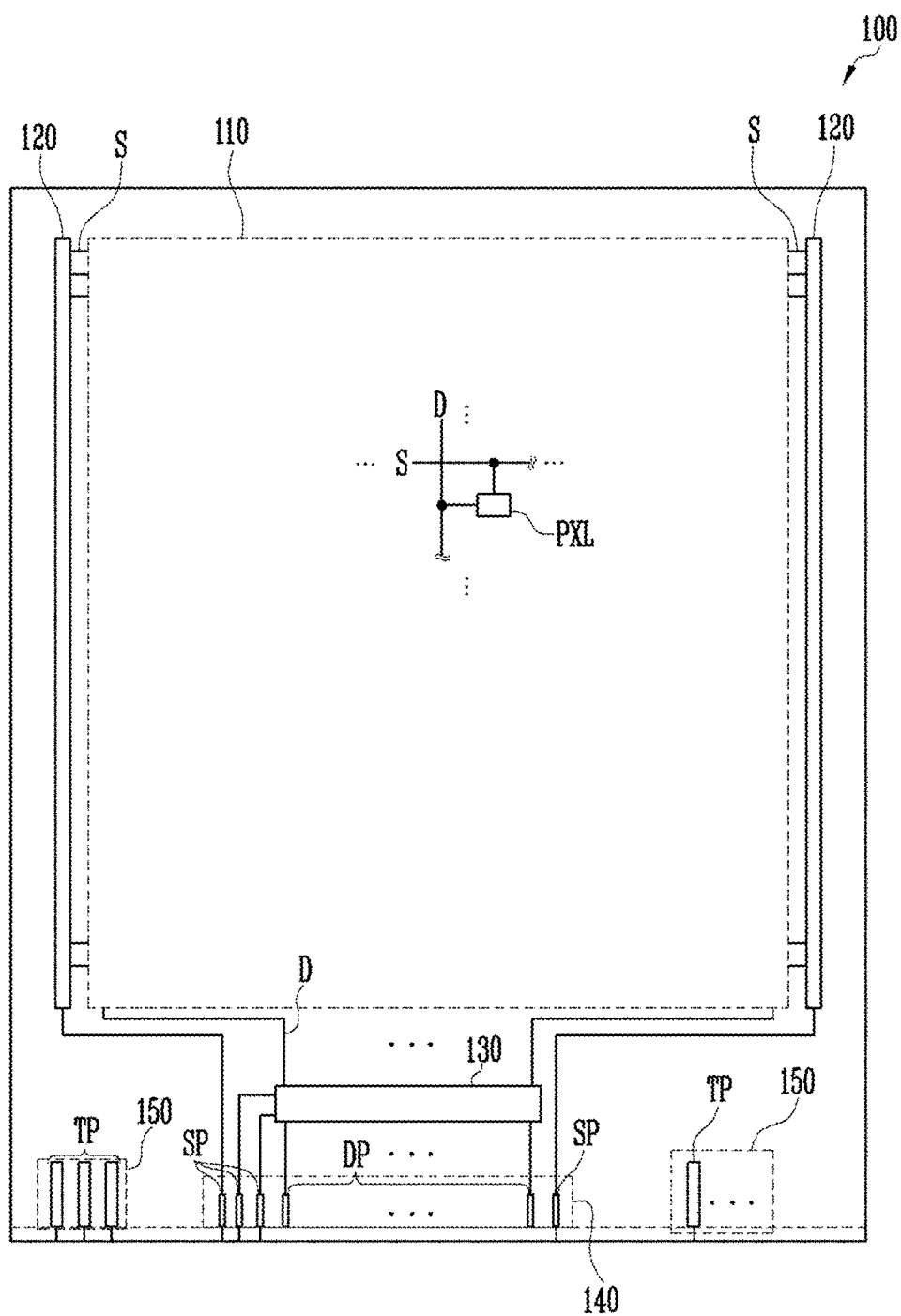

FIGS. 2 and 3 illustrate a panel of an organic light emitting display device according to an exemplary embodiment of the invention. In some exemplary embodiments, FIG. 2 illustrates the panel separated from a mother substrate through primary scribing processes, and FIG. 3 illustrates the panel of which all scribing processes are completed. That is, a panel manufactured through at least two scribing processes is illustrated in FIGS. 2 and 3. However, the invention is not limited thereto, and the panel may be manufactured through at least one scribing process.

Referring to FIG. 2, the panel 100 of the organic light emitting display device according to the exemplary embodiment of the invention includes a display unit 110, a scan driver 120, a test unit 130, a first pad unit 140, and a second pad unit 150.

The display unit 110 includes a plurality of scan lines S, a plurality of data lines D, and pixels PXL connected to the scan lines S and the data lines D. The scan lines S and the data lines D may respectively extend in a first direction (e.g., a horizontal direction) and a second direction (e.g., a vertical direction) to intersect each other.

Each of the pixels PXL may be a pixel that emits light of a specific color. In an exemplary embodiment, each of the pixels PXL may be a red, green, or blue pixel that emits light of red, green, or blue, for example. In the invention, the structure of the pixels PXL is not particularly limited. In an exemplary embodiment, the pixels PXL may include pixel circuits having various structures currently known in the art, for example. In addition, according to the structure of the pixels PXL, at least one kind of control lines (e.g., light emitting control lines), which are not shown, may be further disposed in the display unit 110, and the pixels PXL may be connected to the control lines.

The scan driver 120 may be provided at at least one side of the display unit 110. In an exemplary embodiment, the scan driver 120 may be disposed at both sides (e.g., left and right sides) opposite to each other to be electrically connected to both ends of the scan lines S, for example. The scan driver 120 is supplied with a driving power (e.g., voltage) and a scan control signal through the first pad unit 140, and generates a scan signal, corresponding to the driving power and the scan control signal. The scan signal generated by the scan driver 120 is supplied to the pixels PXL through the scan lines S. Pixels PXL are selected by the scan signal to be electrically connected to the data lines D. The pixels PXL electrically connected to the data lines D may be supplied with a data signal through the data lines D.

An exemplary embodiment in which the scan driver 120 is built in the panel 100 is illustrated in FIG. 2, but the invention is not limited thereto. In an exemplary embodiment, the scan driver 120 may be provided at the outside of the panel 100 to be electrically connected to the panel 100 through the first pad unit 140, for example. In addition, although not shown in FIG. 2, a light emitting control driver (not shown), etc. may be further provided in the panel 100 according to a circuit structure of the pixels PXL. In an exemplary embodiment, the light emitting control driver may be provided at at least one side of the display unit 110 to generate a light emitting control signal, for example. The light emitting control signal generated by the light emitting control driver may be supplied to the pixels PXL through light emitting control lines, to control a light emitting period of the pixels PXL.

The test unit 130 is supplied with a predetermined test signal and a predetermined control signal via the first and second pad units 140 and 150. The test unit 130 supplies a test signal to the data lines D, corresponding to the control signal. In some exemplary embodiments, the test signal and the control signal may be signals for performing an aging process and/or a lighting test. That is, in some exemplary embodiments, the test unit 130 may be a cell test unit for performing a cell test.

In some exemplary embodiments, an array test unit (not shown) for performing an array test may be further provided in the panel 100, or be unitary with the test unit 130 for performing the cell test. The array test unit may perform an array test for testing whether TFTs and capacitors, which constitute the pixel circuit of each of the pixels PXL, are defective.

The first pad unit 140 includes a plurality of data pads DP and a plurality of signal pads SP. In some exemplary embodiments, the signal pads SP may be electrically connected to at least one component constituting the panel 100, e.g., the display unit 110, the scan driver 120, and/or the test unit 130. In an exemplary embodiment, at least some of the signal pads SP may be electrically connected to the scan driver 120 to transmit the driving power and the scan control signal of the scan driver 120, for example. For convenience, a case where only one signal pad SP is connected to each scan driver 120 has been illustrated in FIG. 2, but the invention is not limited thereto, and a plurality of signal pads SP connected to the scan driver 120 may be provided in the first pad unit 140. In addition, although not shown in FIG. 2, a plurality of pads for transmitting pixel power from pixel power sources (e.g., ELVDD and ELVSS) to the display unit 110 may be further provided in the first pad unit 140. The signal pads SP transmit a predetermined driving power or driving signal supplied from the outside to the inside of the panel 100.

The second pad unit 150 includes a plurality of test pads TP electrically connected to predetermined signal pads SP in a manufacturing operation of the panel 100. The test pads TP may be electrically connected to the signal pads SP through respective connection lines disposed in a scribing region SCA and a separation region SPA at a lower end of the panel 100.

In some exemplary embodiments, the second pad unit 150 may be provided in the vicinity of the first pad unit 140. In an exemplary embodiment, the second pad unit 150 may be provided at any one side (e.g., a left or right side) of the first pad unit 140 or be provided at both sides (e.g., left and right sides) of the first pad unit 140, for example.

The second pad unit 150 is electrically connected to an external inspection device while a predetermined test (e.g., a cell test) is being performed on the panel 100 to be supplied with a predetermined test signal, a predetermined again signal, or the like, and transmits it to other components in the panel 100 through the first pad unit 140. In an exemplary embodiment, the second pad unit 150 may be connected a probe pin of an auto probe device to be supplied with a predetermined power, a predetermined test signal, and/or a predetermined control signal for the cell test, and transmit the predetermined power, the predetermined test signal, and/or the predetermined control signal to the first pad unit 140, for example. The power and the signals, transmitted to the first pad unit 140, may be transmitted to the display unit 110, the scan driver 120, the test unit 130, and the like.

After the cell test including the aging process and/or the lighting test is completed, the panel 100 shown in FIG. 2 may be manufactured in a form shown in FIG. 3 through at least one additional scribing process performed along a scribing line SCL. That is, the panel 100 shown in FIG. 3 may be manufactured by removing the separation region SPA at lower ends of the first and second pad units 140 and 150 through the scribing process performed along the scribing line SCL. In this case, the second pad unit 150 may be electrically separated (i.e., insulated) from the first pad unit 140 through the scribing process. In some exemplary embodiments, the test pads TP provided in the second pad unit 150 may be electrically isolated after the scribing process or be supplied with a predetermined bias signal. In an exemplary embodiment, on the final panel 100, the second pad unit 150 may be electrically isolated from other components constituting the panel 100, for example.

In FIG. 2, the scribing region SCA may be a region set at the lower ends of the first and second pad units 140 and 150 by considering the range of errors that may occur in the scribing process. In an exemplary embodiment, the scribing region SCA may be a region including the range of errors in both directions about a predetermined scribing line SCL, for example.

The separation region SPA is a region disposed at a lower end of the scribing region SCA. The separation region SPA is separated from the panel 100 through an additional scribing process. The separation region SPA may be a region through which connection lines CL for electrically connecting predetermined signal pads SP and predetermined test pads TP, which correspond to each other, pass. That is, each of the connection lines CL is formed to pass through the separation region SPA. Thus, as the scribing process is performed, the connection lines CL are disconnected. Accordingly, the first pad unit 140 and the second pad unit 150 are not electrically connected to each other in the panel 100 on which scribing processes are all completed.

An exemplary embodiment in which the second pad unit 150 remains in the panel 100 in a state in which the second pad 150 is electrically isolated has been illustrate in FIG. 3, but the invention is not limited thereto. In another exemplary embodiment, the second pad unit 150 may be separated from the panel 100 through one or more scribing processes, for example.

However, the scribing region SCA may be set such that the first pad unit 140 and the like are not damaged by considering a process error. Therefore, one region of the connection lines CL passing through the scribing region SCA or a connection part between the signal pads SP and the connection lines CL remains even in the panel 100 of which scribing process is completed. In an exemplary embodiment, the one region of the connection lines CL passing through the scribing region SCA or the connection part between the signal pads SP and the connection lines CL remains in the panel 100 in a state in which it is physically and/or electrically connected to one ends of at least some signal pads SP and test pads TP, for example.

A module process may be performed on the panel 100 determined as a good product through the cell test. In some exemplary embodiments, a data driver (not shown) and the like may be mounted on the panel 100. In an exemplary embodiment, the data driver may be bonded to the data pads DP in a chip on glass ("COG") manner, for example. The data driver generates a data signal corresponding to image data and a data control signal, which are input from the outside, and supplies the data signal to the data lines D. The data signal supplied to the data lines D is supplied to pixels PXL on a horizontal line selected by the scan signal.

In FIGS. 2 and 3, numbers and positions of pads DP, SP, and TP provided in the first and second pads 140 and 150 and the lines connecting the pads DP, SP, and TP and components of the panel 100 are illustrated for convenience, and may be variously changed, when necessary.

Figure 4:
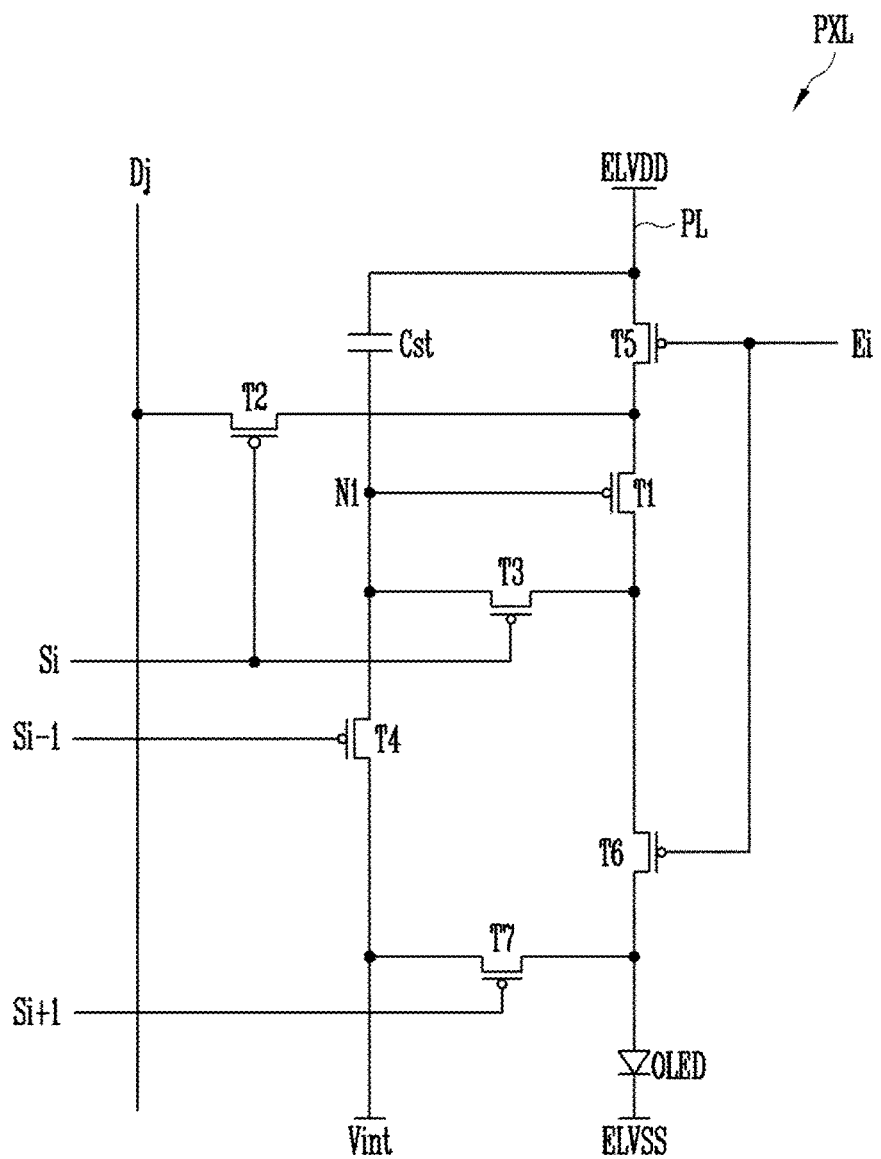
FIG. 4 illustrates a pixel according to an exemplary embodiment of the invention.

FIG. 4 illustrates a pixel PXL according to an exemplary embodiment of the invention. For convenience, a pixel PXL disposed on an ith (i is a natural number) row and a jth (j is a natural number) column of the display unit is illustrated in FIG. 4. In FIG. 4, an ith scan line Si may be a current scan line for supplying a scan signal to pixels on the ith row. In addition, other scan lines Si−1 and Si+1 connected to the pixel PXL are used as initialization control lines for controlling initialization, and may be used as current scan lines in pixels on adjacent rows, e.g., pixels on an (i−1)th row and an (i+1)th row. Hereinafter, for convenience, a current scan line on the (i−1)th row is referred to as an "(i−1)th scan line Si−1," a current scan line on the ith row is referred to as an "ith scan line Si," a current scan line on the (i+1)th row is referred to as an "(i+1)th scan line Si+1," a light emitting control line on the ith row is referred to as a "light emitting control line Ei," a data line on the jth column is referred to as a "data line Dj," and a power line on the jth column to which a first power from a first power source ELVDD is applied is referred to as a "power line PL."

Referring to FIG. 4, the pixel PXL according to the exemplary embodiment of the invention may include an OLED, first to seventh transistors T1 to T7, and a storage capacitor Cst.

An anode electrode of the OLED may be connected to the first transistor T1 via the sixth transistor T6, and a cathode electrode of the OLED may be connected to a second power source ELVSS. The OLED generates light with a predetermined luminance corresponding to the amount of current supplied from the first transistor T1. A voltage of a first power source ELVDD may be set higher than that of the second power source ELVSS such that current may flow through the OLED.

The seventh transistor T7 may be connected between an initialization power source Vint and the anode electrode of the OLED. In addition, a gate electrode of the seventh transistor T7 may be connected to an (i+1)th scan line Si+1. The seventh transistor T7 may be turned on when a scan signal is supplied to the (i+1)th scan line Si+1, to supply a voltage of the initialization power source Vint to the anode electrode of the OLED. Here, the voltage of the initialization power source Vint may be set to a lower voltage than a data signal. That is, the voltage of the initialization power source Vint may be set to be not greater than a minimum voltage of the data signal. In the illustrated exemplary embodiment, a case where an anode initialization control line connected to the gate electrode of the seventh transistor T7 is the (i+1)th scan line Si+1 has been illustrated as an example, but the invention is not limited thereto. In another exemplary embodiment, the gate electrode of the seventh transistor T7 may be connected to the ith scan line Si, for example. In this case, the voltage of the initialization power source Vint may be supplied to the anode electrode of the OLED via the seventh transistor T7 when a scan signal is supplied to the ith scan line Si.

The sixth transistor T6 may be connected between the first transistor T1 and the OLED. In addition, a gate electrode of the sixth transistor T6 may be connected to a light emitting control line Ei. The sixth transistor T6 may be turned off when a light emitting control signal (e.g., a light emitting control signal having a gate-off voltage (high-level voltage)) is supplied to the light emitting control line Ei, and turned on otherwise.

The fifth transistor T5 may be connected between the first power source ELVDD and the first transistor T1. In addition, a gate electrode of the fifth transistor T5 may be connected to the light emitting control line Ei. The fifth transistor T5 may be turned off when the light emitting control signal is supplied to the light emitting control line Ei, and tuned on otherwise.

A first electrode of the first transistor (e.g., driving transistor) T1 may be connected to the first power source ELVDD via the fifth transistor T5, and a second electrode of the first transistor T1 may be connected to the anode electrode of the OLED via the sixth transistor T6. In addition, a gate electrode of the first transistor T1 may be connected to a first node N1. The first transistor T1 may control the amount of current flowing from the first power source ELVDD to the second power source ELVSS via the OLED, corresponding to a voltage of the first node N1.

The third transistor T3 may be connected between the second electrode of the first transistor T1 and the first node N1. In addition, a gate electrode of the third transistor T3 may be connected to the ith scan line Si. The third transistor T3 may be turned on when the scan signal is supplied to the ith scan line Si, to allow the second electrode of the first transistor T1 and the first node N1 to be electrically connected to each other. Therefore, when the third transistor T3 is turned on, the first transistor T1 may be diode-connected.

The fourth transistor T4 may be connected between the first node N1 and the initialization power source Vint. In addition, a gate electrode of the fourth transistor T4 may be connected to an (i−1)th scan line Si−1. The fourth transistor T4 may be turned on when the scan signal is supplied to the (i−1)th scan line Si−1, to supply the voltage of the initialization power source Vint to the first node N1. In the illustrated exemplary embodiment, the (i−1)th scan line Si−1 may be used as an initialization control line for initializing a gate node of the first transistor T1, i.e., the first node N1. However, the invention is not limited thereto. In another exemplary embodiment, another control line such as an (i−2)th scan line Si−2 may be used as the initialization control line for initializing the gate node of the first transistor T1, for example.

The second transistor T2 may be connected between a data line Dj and the first electrode of the first transistor T1. In addition, a gate electrode of the second transistor T2 may be connected to the ith scan line Si. The second transistor T2 may be turned on when the scan signal is supplied to the ith scan line Si, to electrically connect the data line Dj and the first electrode of the first transistor T1 to each other.

The storage capacitor Cst may be connected between the first power source ELVDD and the first node N1. The storage capacitor Cst may store voltages corresponding to the data signal and a threshold voltage of the first transistor T1.

The structure of the pixel PXL is not limited to the exemplary embodiment shown in FIG. 4. In other exemplary embodiments, it will be apparent that pixel circuits having various structures known in the art may be applied to the pixel PXL, for example.

Figure 5:
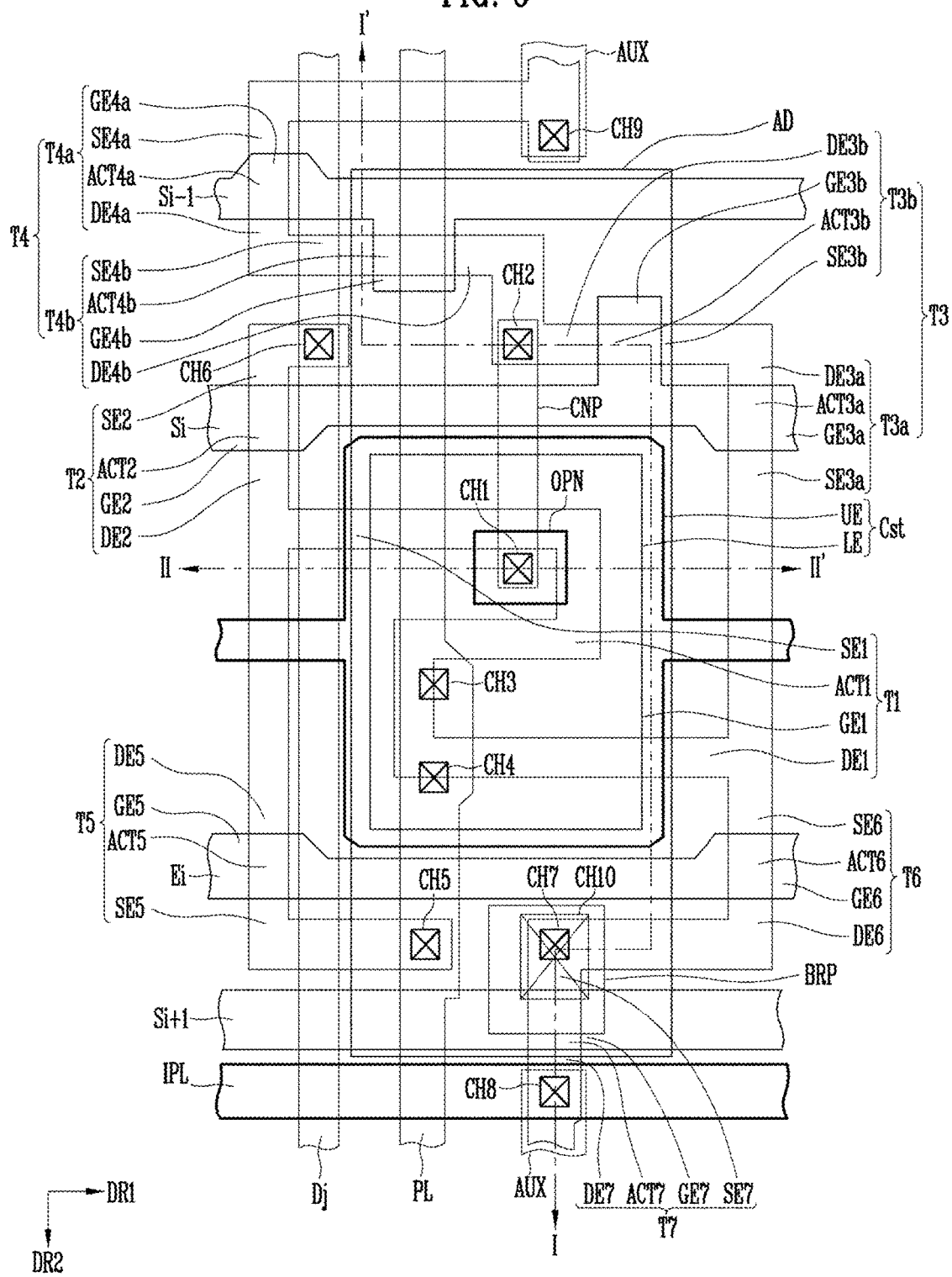
FIG. 5 illustrates an exemplary embodiment of a detailed structure of the pixel shown in FIG. 4.
Figure 6:
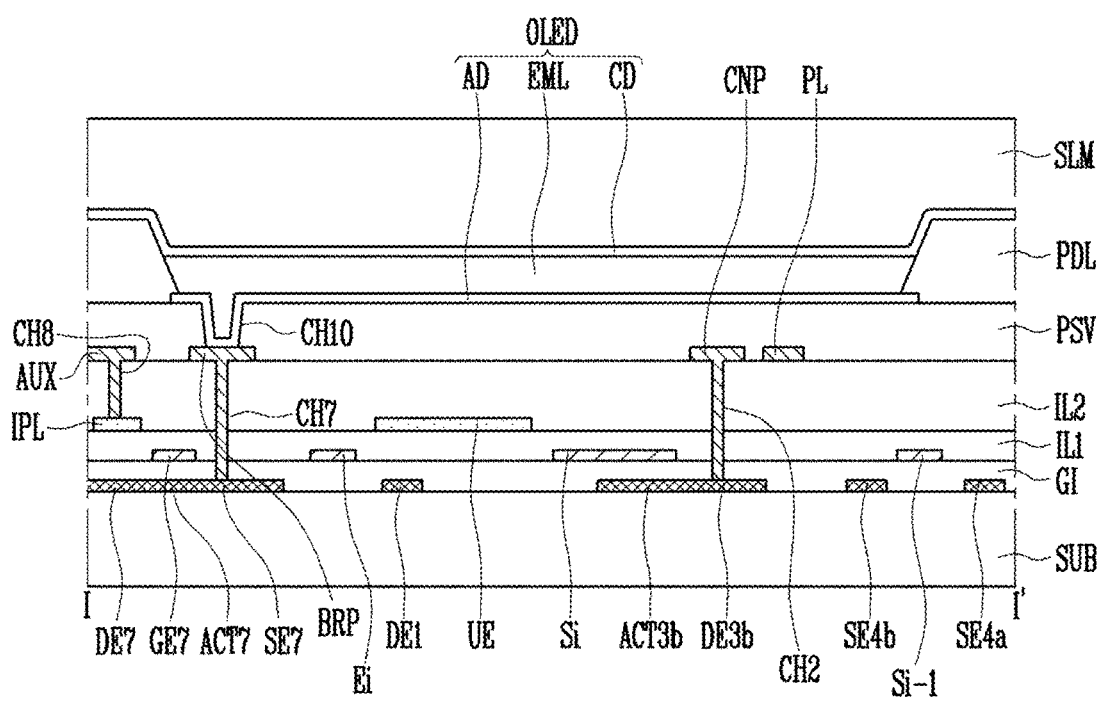
FIG. 6 illustrates a section taken along line I-I' of FIG. 5.
Figure 7:
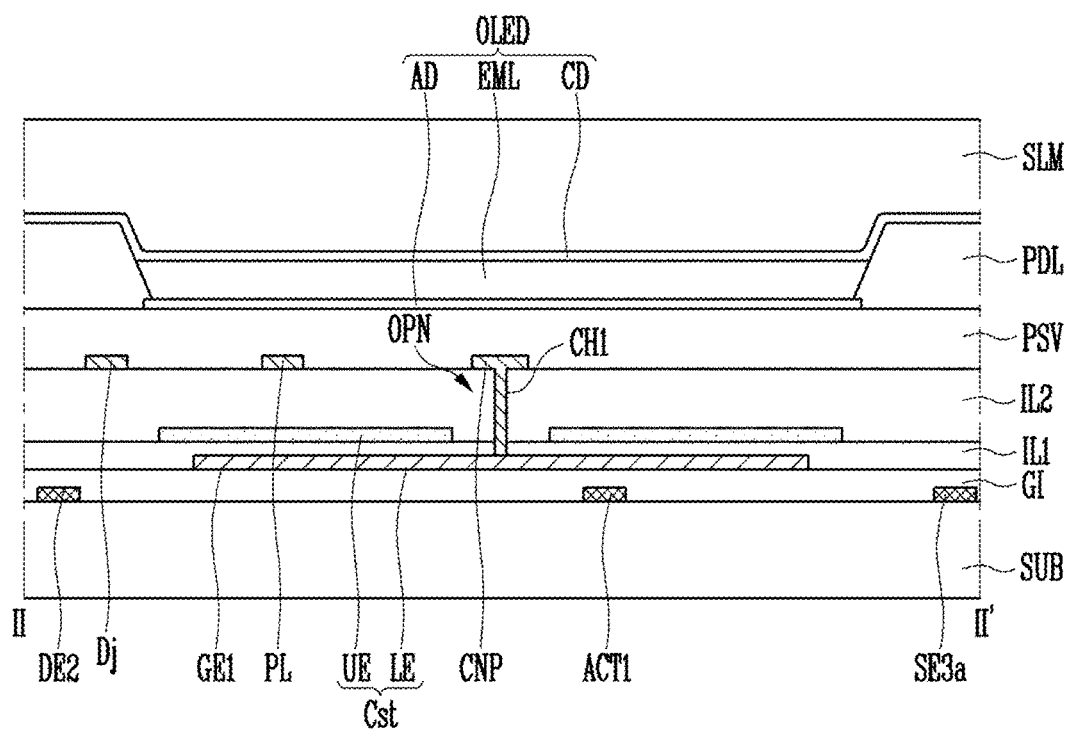
FIG. 7 illustrates a section taken along line II-II' of FIG. 5.

FIG. 5 illustrates an exemplary embodiment of a detailed structure of the pixel shown in FIG. 4. Particularly, FIG. 5 is a plan view illustrating in detail a layout of an exemplary embodiment of the pixel shown in FIG. 4. FIG. 6 illustrates a section taken along line I-I' of FIG. 5. FIG. 7 illustrates a section taken along line II-IP of FIG. 5.

Referring to FIGS. 5 to 7, the organic light emitting display device according to the exemplary embodiment of the invention may include a substrate SUB, a line unit, and pixels PXL (refer to FIG. 4).

The line unit supplies driving signals and/or power to each of the pixels PXL. In some exemplary embodiments, the line unit may include scan lines Si−1, Si, and Si+1, a data line Dj, a light emitting control line Ei, a power line PL, and an initialization power line IPL.

The scan lines Si−1, Si, and Si+1 may extend in a first direction DR1. In some exemplary embodiments, the scan lines Si−1, Si, and Si+1 may include an (i−1)th scan line Si−1, an ith scan line Si, and an (i+1)th scan line Si+1, which are sequentially arranged along a second direction DR2 intersecting the first direction DR1. The scan lines Si−1, Si, and Si+1 may be applied with scan signals. In an exemplary embodiment, the (i−1)th scan line Si−1 may be applied with an (i−1)th scan signal, the ith scan line Si may be applied with an ith scan signal, and the (i+1)th scan line Si+1 may be applied with an (i+1)th scan signal, for example.

Like the scan lines Si−1, Si, and Si+1, the light emitting control line Ei may extend in the first direction DR1. The light emitting control line Ei may be applied with a light emitting control signal.

The data line Dj may extend in the second direction DR2. That is, the data line Dj may extend in a direction intersecting the scan lines Si−1, Si, and Si+1 and the light emitting control line Ei. The data line Dj may be applied with a data signal.

The power line PL may extend along the second direction DR2, but the invention is not limited thereto. The power line PL is disposed to be spaced apart from the data line Dj, and may be applied with the first power from the first power source ELVDD (refer to FIG. 4).

The initialization power line IPL may extend along the first direction DR1, but the invention is not limited thereto. The initialization power line IPL may be applied with the initialization power from the initialization power source Vint (refer to FIG. 4).

In some exemplary embodiments, each of the pixel PXL may include first to seventh transistors T1 to T7, a storage capacitor Cst, and an OLED (refer to FIG. 4).

The first transistor T1 may include a first gate electrode GE1, a first active pattern ACT1, a first source electrode SE1, a first drain electrode DE1, and a first connection pattern CNP. The first gate electrode GE1 may be connected to a third drain electrode DE3$a$/DE3$b$ of the third transistor T3 and a fourth drain electrode DE4$a$/DE4$b$ (or a fourth source electrode SE4$a$/SE4$b$) of the fourth transistor T4. In some exemplary embodiments, the first connection pattern CNP may connect the first gate electrode GE1 to the third and fourth drain electrodes DE3$a$/DE3$b$ and DE4$a$/DE4$b$. One end of the first connection pattern CNP may be connected to the first gate electrode GE1 through a first contact hole CH1, and the other end of the first connection pattern CNP may be connected to the third and fourth drain electrodes DE3a/DE3b and DE4a/DE4b through a second contact hole CH2.

In an exemplary embodiment of the invention, the first active pattern ACT1, the first source electrode SE1, and the first drain electrode DE1 may include a semiconductor layer undoped or doped with impurities. In an exemplary embodiment, the first source electrode SE1 and the first drain electrode DE1 may include a semiconductor layer doped with impurities, and the active pattern ACT1 may include a semiconductor layer undoped with impurities, for example.

An exemplary embodiment in which source and drain electrodes (e.g., the first source electrode SE1 and the first drain electrode DE1) of each transistor (e.g., the first transistor T1) of the first to seventh transistors T1 to T7 are unitary with an active pattern (e.g., the first active pattern ACT1) has been illustrated in FIGS. 5 to 7, but the invention is not limited thereto. In another exemplary embodiment, source and drain electrodes (e.g., SE1 to SE7 and DE1 to DE7) of at least one transistor of the first to seventh transistors T1 to T7 provided in each pixel PXL may be provided in a different layer from that of active patterns ACT1 to ACT7 to be connected to the active patterns ACT1 to ACT7, for example. In another exemplary embodiment of the invention, source and drain electrodes (e.g., SE1 to SE7 and DE1 to DE7) of at least one transistor of the first to seventh transistors T1 to T7 provided in each pixel PXL may be provided with a conductive layer (e.g., a metal layer, etc.) provided in a different layer from that of active patterns ACT1 to ACT7 to be physically and/or electrically connected to the active patterns ACT1 to ACT7 through at least one contact hole, for example.

In some exemplary embodiments, the first active pattern ACT1 has a bar shape extending in a predetermined direction, and may have a shape in which the first active pattern ACT1 is bent plural times along the extending direction. The first active pattern ACT1 may overlap with the first gate electrode GE1 in a plan view. As the first active pattern ACT1 is formed long, a channel region of the first transistor T1 may be formed long. Thus, the driving range of a gate voltage applied to the first transistor T1 is widened. Accordingly, the gray scale of light emitted from the light emitting diode OLED may be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5.

The first drain electrode DE1 may be connected to the other end of the first active pattern ACT1. The first drain electrode DE1 may be connected to a third source electrode SE3a/SE3b of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith scan line Si. The second gate electrode GE2 may be provided as a portion of the ith scan line Si or may be provided in a shape protruding from the ith scan line Si.

In some exemplary embodiments, the second active pattern ACT2, the second source electrode SE2, and the second drain electrode DE2 may include a semiconductor undoped or doped with impurities. In an exemplary embodiment, the second source electrode SE2 and the second drain electrode DE2 may include a semiconductor doped with impurities, and the second active pattern ACT2 may include a semiconductor layer undoped with impurities, for example. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3b, a 3bth source electrode SE3b, and a 3bth drain electrode DE3b. Hereinafter, the 3ath gate electrode GE3a and the 3bth gate electrode GE3b are referred to as a third gate electrode GE3a/GE3b, the 3ath active pattern ACT3a and the 3bth active pattern ACT3b are referred to as a third active pattern ACT3a/ACT3b, the 3ath source electrode SE3a and the 3bth source electrode SE3b are referred to as the third source electrode SE3a/SE3b, and the 3ath drain electrode DE3a and the 3bth drain electrode DE3b are referred to as the third drain electrode DE3a/DE3b.

The third gate electrode GE3a/GE3b may be connected to the ith scan line Si. The third gate electrode GE3a/GE3b may be provided as a portion of the ith scan line Si or may be provided in a shape protruding from the ith first scan line S1i. In an exemplary embodiment, the 3ath gate electrode GE3a may be provided as a portion of the ith scan line Si, and the 3bth gate electrode GE3b may be provided in a shape protruding from the ith scan line Si, for example.

The third active pattern ACT3a/ACT3b, the third source electrode SE3a/SE3b, and the third drain electrode DE3a/DE3b may include a semiconductor layer undoped or doped with impurities. In an exemplary embodiment, the third source electrode SE3a/SE3b and the third drain electrode DE3a/DE3b may include a semiconductor layer doped with impurities, and the third active pattern ACT3a/ACT3b may include a semiconductor layer undoped with impurities, for example. The third active pattern ACT3a/ACT3b corresponds to a portion overlapping with the third gate electrode GE3a/GE3b. One end of the third source electrode SE3a/SE3b may be connected to the third active pattern ACT3a/ACT3b. The other end of the third source electrode SE3a/SE3b may be connected to the first drain electrode DE1 of the first transistor T1 and the sixth source electrode SE6 of the sixth transistor T6. One end of the third drain electrode DE3a/DE3b may be connected to the third active pattern ACT3a/ACT3b. The other end of the third drain electrode DE3a/DE3b may be connected to the fourth drain electrode DE4a/DE4b (or the fourth source electrode SE4a/SE4b) of the fourth transistor T4. Also, the third drain electrode DE3a/DE3b may be connected to the first gate electrode GE1 of the first transistor T1 through the first connection pattern CNP, the second contact hole CH2, and the first contact hole CH1.

The fourth transistor T4 may be provided in a double gate structure so as to prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4a/GE4b, the 4ath active pattern ACT4a and the 4bth active pattern ACT4b are referred to as a fourth active pattern ACT4a/ACT4b, the 4ath source electrode SE4a and the 4bth source electrode SE4b are referred to as a fourth source electrode SE4a/SE4b, and the 4ath drain electrode DE4a and the 4bth drain electrode DE4b are referred to as the fourth drain electrode DE4a/DE4b.

The fourth gate electrode GE4a/GE4b may be connected to the (i−1)th scan line Si−1. The fourth gate electrode GE4a/GE4b may be provided as a portion of the (i−1)th scan line Si−1 or may be provided in a shape protruding from the (i−1)th scan line Si−1. In an exemplary embodiment, the 4ath gate electrode GE4a may be provided as a portion of the (i−1)th scan line Si−1, and the 4bth gate electrode GE4b may be provided in a shape protruding from the (i−1)th scan line Si−1, for example.

The fourth active pattern ACT4a/ACT4b, the fourth source electrode SE4a/SE4b, and the fourth drain electrode DE4a/DE4b may include a semiconductor layer undoped or doped with impurities. In an exemplary embodiment, the fourth source electrode SE4a/SE4b and the fourth drain electrode DE4a/DE4b may include a semiconductor layer doped with impurities, and the fourth active pattern ACT4a/ACT4b may include a semiconductor layer undoped with impurities, for example. The fourth active pattern ACT4a/ACT4b corresponds to a portion overlapping with the fourth gate electrode GE4a/GE4b.

One end of the fourth source electrode SE4a/SE4b may be connected to the fourth active pattern ACT4a/ACT4b. The other end of the fourth source electrode SE4a/SE4b may be connected to an initialization power line IPL of a pixel PXL on an (i−1)th row and a seventh drain electrode DE7 of a seventh transistor T7 of the pixel PXL on the (i−1)th row. An auxiliary connection pattern AUX may be provided between the fourth source electrode SE4a/SE4b and the initialization power line IPL. One end of the auxiliary connection pattern AUX may be connected to the fourth source electrode SE4a/SE4b through a ninth contact hole CH9. The other end of the auxiliary connection pattern AUX may be connected to an initialization power line IPL on the (i−1)th row through an eighth contact hole CH8 of the pixel PXL on the (i−1)th row.

One end of the fourth drain electrode DE4a/DE4b may be connected to the fourth active pattern ACT4a/ACT4b. The other end of the fourth drain electrode DE4a/DE4b may be connected to the third drain electrode DE3a/DE3b of the third transistor T3. Also, the fourth drain electrode DE4a/DE4b may be connected to the first gate electrode GE1 of the first transistor T1 through the first connection patter CNP, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the light emitting control line Ei. The fifth gate electrode GE5 may be provided as a portion of the light emitting control line Ei or may be provided in a shape protruding from the light emitting control line Ei.

The fifth active pattern ACT5, the fifth source electrode SE5, and the fifth drain electrode DE5 may include a semiconductor layer undoped or doped with impurities. In an exemplary embodiment, the fifth source electrode SE5 and the fifth drain electrode DE5 may include a semiconductor layer doped with impurities, and the fifth active pattern ACT5 may include a semiconductor layer undoped with impurities, for example. The fifth active pattern ACT5 corresponds to a portion overlapping with the fifth gate electrode GE5.

One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the light emitting control line Ei. The sixth gate electrode SE6 may be provided as a portion of the light emitting control line Ei or may be provided in a shape protruding from the light emitting control line Ei.

The sixth active pattern ACT6, the sixth source electrode SE6, and the sixth drain electrode DE6 may include a semiconductor layer undoped or doped with impurities. In an exemplary embodiment, the sixth source electrode SE6 and the sixth drain electrode DE6 may include a semiconductor layer doped with impurities, and the sixth active pattern ACT6 may include a semiconductor layer undoped with impurities, for example. The sixth active pattern ACT6 corresponds to a portion overlapping with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3a/SE3b of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the (i+1)th scan line Si+1. The seventh gate electrode GE7 may be provided as a portion of the (i+1)th scan line Si+1 or may be provided in a shape protruding from the (i+1)th scan line Si+1.

The seventh active pattern ACT7, the seventh source electrode SE7, and the seventh drain electrode DE7 may include a semiconductor layer undoped or doped with impurities. In an exemplary embodiment, the seventh source electrode SE7 and the seventh drain electrode DE7 may include a semiconductor layer doped with impurities, and the seventh active layer ACT7 may include a semiconductor layer undoped with impurities, for example. The seventh active pattern ACT7 corresponds to a portion overlapping with the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL.

The storage capacitor Cst may include a lower electrode LE and an upper electrode UE. The lower electrode LE may be formed as the first gate electrode GE1 of the first transistor T1. The upper electrode UE overlaps with the first gate electrode GE1, and may cover the lower electrode LE in a plan view (e.g., in a top view). As the overlapping area of the upper electrode UE and the lower electrode LE is widened or increased, the capacitance of the storage capacitor Cst may be increased.

In some exemplary embodiments, the upper electrode UE may extend in the first direction DR1. A voltage having the same level as that of the first power may be applied to the upper electrode UE. An opening OPN may be defined in the upper electrode UE in a region in which the first contact hole CH1 through which the first gate electrode GE1 and the first connection pattern CNP are in contact with each other is defined.

The OLED may include a first electrode AD, a second electrode CD, and an emitting layer EML provided between the first electrode AD and the second electrode CD.

The first electrode AD may be provided in a light emitting region corresponding to each pixel PXL. The first electrode AD may be connected to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The bridge pattern BRP may connect the first electrode AD to the sixth drain electrode DE6 and the seventh source electrode SE7.

Hereinafter, a structure of the organic light emitting display device according to the exemplary embodiment of the invention will be described along a stacking order with reference to FIGS. 5 to 7.

First, an active pattern layer may be disposed on the substrate SUB. In some exemplary embodiments, the active patterns ACT1 to ACT7 may be provided in the active pattern layer. In some exemplary embodiments, the active patterns may include the first to seventh active patterns ACT1 to ACT7. The first to seventh active patterns ACT1 to ACT7 may include a semiconductor material. In some exemplary embodiments, a buffer layer (not shown) may be provided between the substrate SUB and the first to seventh active patterns ACT1 to ACT7.

A first insulating layer GI may be provided on the substrate SUB on which the first to seventh active patterns ACT1 to ACT7 are provided. In some exemplary embodiments, the first insulating layer GI may be a gate insulating layer interposed between the active patterns ACT1 to ACT7 and the gate electrodes GE1 to GE7 of the transistors T1 to T7 provided in the pixels PXL (refer to FIG. 4). In some exemplary embodiments, the first gate insulating layer GI may include one or more inorganic layers and/or one or more organic layers. In an exemplary embodiment, the first insulating layer GI may include an inorganic layer including $SiO_x$, $SiN_x$, or the like, but the invention is not limited thereto, for example. In an exemplary embodiment, the first insulating layer GI may include an inorganic insulating material or organic insulating material such as $SiO_x$, $SiN_x$, SiON, SiOF, or $AlO_x$, for example. The first insulating layer GI may be a single layer or multi-layer including at least one of these materials.

A first conductive layer, e.g., a first gate layer may be disposed on the first insulating layer GI. In some exemplary embodiments, the scan lines Si−1, Si, Si+1, the light emitting control line Ei, and the gate electrodes GE1 to GE7 may be provided in the first conductive layer. In some exemplary embodiments, one electrode, e.g., the lower electrode LE of the storage capacitor Cst may be provided in the first conductive layer. Specifically, the (i−1)th scan line Si−1, the ith scan line Si, the (i+1)th scan line Si+1, the light emitting control line Ei, and the first to seventh gate electrodes GE1 to GE7 may be provided in the first conductive layer on the first insulating layer GI. In some exemplary embodiments, the first gate electrode GE1 may become the lower electrode LE of the storage capacitor Cst. That is, in some exemplary embodiments, the first gate electrode GE1 and the lower electrode LE of the storage capacitor Cst may be unitary. In some exemplary embodiments, the second gate electrode GE2 and the third gate electrode GE3a/GE3b may be unitary with the ith scan line Si. In some exemplary embodiments, the fourth gate electrode GE4a/GE4b may be unitary with the (i−1)th scan line Si−1. In some exemplary embodiments, the fifth gate electrode GE5 and the sixth gate electrode GE6 may be unitary with the light emitting control line Ei. In some exemplary embodiments, the seventh gate electrode GE7 may be unitary with the (i+1)th scan line Si+1.

In some exemplary embodiments, the scan lines Si−1, Si, Si+1, the light emitting control line Ei, the gate electrodes GE1 to GE7, and/or the lower electrode LE of the storage capacitor Cst, which are disposed in the first conductive layer, may include the same material with one another. In an exemplary embodiment, the scan lines Si−1, Si, Si+1, the light emitting control line Ei, the gate electrodes GE1 to GE7, and/or the lower electrode LE of the storage capacitor Cst may include a predetermined first gate metal, for example.

In some exemplary embodiments, examples of the metal may include the first gate metal, may be Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and may include various other metals as well as the above-described metals. Examples of the alloy may include the first gate metal may be MoTi, AlNiLa, and the like, and may include various other alloys as well as the above-described alloys. Examples of the multi-layer may include the first gate metal may be Ti/Cu, Ti/Au, Mo/Al/Mo, ITO/Ag/ITO, TiN/Ti/Al/Ti, TiN/Ti/Cu/Ti, and the like, and may include various conductive materials having various other multi-layered structures as well as the above-described multi-layers.

The material of the scan lines Si−1, Si, Si+1, the light emitting control line Ei, the gate electrodes GE1 to GE7, and/or the lower electrode LE of the storage capacitor Cst, which are disposed in the first conductive layer, is not necessarily limited to the metal. That is, any material capable of providing conductivity to a degree to which the pixels PXL may be smoothly driven may be used as the material of the scan lines Si−1, Si, Si+1, the light emitting control line Ei, the gate electrodes GE1 to GE7, and/or the lower electrode LE of the storage capacitor Cst.

In an exemplary embodiment, the scan lines Si−1, Si, Si+1, the light emitting control line Ei, the gate electrodes GE1 to GE7, and/or the lower electrode LE of the storage capacitor Cst may include a conductive polymer or conductive metal oxide, for example. Examples of the conductive polymer may include the scan lines Si−1, Si, Si+1, the light emitting control line Ei, the gate electrodes GE1 to GE7, and/or the lower electrode LE of the storage capacitor Cst may be polythiophene-based, polypyrrole-based, polyaniline-based, polyacetylene-based, and polyphenylene-based compounds, combinations thereof, and the like, and particularly, may include a PEDOT/PSS compound among the polythiophene-based compounds. Examples of the conductive metal oxide may include the scan lines Si−1, Si, Si+1, the light emitting control line Ei, the gate electrodes GE1 to GE7, and/or the lower electrode LE of the storage capacitor Cst may be indium tin oxide ("ITO"), indium zinc oxide ("IZO"), aluminum-doped zinc oxide ("AZO"), indium tin zinc oxide ("ITZO"), ZnO, $SnO_2$, and the like.

A second insulating layer IL1 may be provided on the first conductive layer. In some exemplary embodiments, the second insulating layer IL1 may be a first interlayer insulating layer interposed between the lower electrode LE and the upper electrode UE of the storage capacitor Cst.

In some exemplary embodiments, the second insulating layer IL1 may include one or more inorganic layers and/or one or more organic layers. In an exemplary embodiment, the second insulating layer IL1 may include an inorganic layer including $SiO_x$, $SiN_x$, or the like, for example, but the invention is not limited thereto. In an exemplary embodiment, the second insulating layer IL1 may include an inorganic insulating material or organic insulating material such as $SiO_x$, $SiN_x$, SiON, SiOF, or $AlO_x$. The second insulating layer IL1 may be a single layer or multi-layer including at least one of these materials.

A second conductive layer, e.g., a second gate layer, may be disposed on the second insulating layer IL1. In some exemplary embodiments, the upper electrode UE of the storage capacitor Cst and the initialization power line IPL may be provided in the second conductive layer. In some exemplary embodiments, the upper electrode UE may cover the lower electrode LE. As the upper electrode UE overlaps with the lower electrode LE with the second insulating layer IL1 interposed therebetween, the upper electrode UE along with the lower electrode LE may constitute the storage capacitor Cst.

In some exemplary embodiments, the upper electrode UE of the storage capacitor Cst and the initialization power line IPL, which are disposed in the second conductive layer, may include the same material with each other. In an exemplary embodiment, the upper electrode UE of the storage capacitor Cst and the initialization power line IPL may include a predetermined second gate metal, for example. In some exemplary embodiments, the second gate metal may be one of the metals proposed as examples of the first gate metal described above, but the invention is not limited thereto. In addition, the material of the upper electrode UE of the storage capacitor Cst and the initialization power line IPL, which are disposed in the second conductive layer, is not necessarily limited to the metal. That is, any material capable of providing conductivity to a degree to which the pixels PXL may be smoothly driven may be used as the material of the upper electrode UE of the storage capacitor Cst and the initialization power line IPL. In an exemplary embodiment, the upper electrode UE of the storage capacitor Cst and the initialization power line IPL may include a conductive polymer or conductive metal oxide, for example.

A third insulating layer IL2 may be provided on the second conductive layer. In some exemplary embodiments, the third insulating layer IL2 may be a second interlayer insulating layer. In some exemplary embodiments, the third insulating layer IL2 may include one or more inorganic layers and/or one or more organic layers. In an exemplary embodiment, the third insulating layer IL2 may include an inorganic layer including $SiO_x$, $SiN_x$, or the like, for example, but the invention is not limited thereto. In an exemplary embodiment, the second insulating layer IL1 may include an inorganic insulating material or organic insulating material such as $SiO_x$, $SiN_x$, SiON, SiOF, or $AlO_x$. The second insulating layer IL1 may be a single layer or multi-layer including at least one of these materials.

A third conductive layer, e.g., a source-drain layer may be disposed on the third insulating layer IL2. In some exemplary embodiments, the data line Dj, the power line PL, the first connection pattern CNP, the auxiliary connection pattern AUX, and the bridge pattern BRP may be provided in the third conductive layer. For convenience, patterns and lines, i.e., the data line Dj, the power line PL, the first connection pattern CNP, the auxiliary connection pattern AUX, the bridge pattern BRP, and the like, which are provided in the source-drain layer, will be inclusively referred to as a "source-drain pattern." In some exemplary embodiments, at least one portion of the source-drain pattern may be connected to at least one of source and drain electrodes (e.g., SE1 to SE7 and DE1 to DE7) of at least some of the first to seventh transistors T1 to T7 provided in each pixel PXL. In an exemplary embodiment, the data line Dj may be physically and/or electrically connected to the second source electrode SE2 of the second transistor T2, for example. In another exemplary embodiment of the invention, when source and drain electrodes (e.g., SE1 to SE7 and DE1 to DE7 in FIG. 5) of at least one transistor of the first to seventh transistors T1 to T7 are provided in a different layer from that of the active patterns ACT1 to ACT7, the source and drain electrodes (e.g., SE1 to SE7 and DE1 to DE7) according to the another exemplary embodiment may be provided in the third conductive layer together with the data line Dj, the power line PL, the first connection pattern CNP, the auxiliary connection pattern AUX, and/or the bridge pattern BRP. That is, in some exemplary embodiments, the source and drain electrodes (e.g., SE1 to SE7 and DE1 to DE7) of at least one transistor of the first to seventh transistors T1 to T7 may be included in the source-drain pattern.

In some exemplary embodiments, the data line Dj may be connected to the second source electrode SE2 through the sixth contact hole CH6 passing through the first insulating layer GI, the second insulating layer IL1, and the third insulating layer IL2.

In some exemplary embodiments, the power line PL may be connected to the upper electrode UE of the storage capacitor Cst through third and fourth contact holes CH3 and CH4 passing through the third insulating layer IL2. Also, the power line PL may be connected to the fifth source electrode SE5 through the fifth contact hole CH5 passing through the first insulating layer GI, the second insulating layer ILL and the third insulating layer IL2.

In some exemplary embodiments, the first connection pattern CNP may be connected to the first gate electrode GE1 through the first contact hole CH1 passing through the second insulating layer IL1 and the third insulating layer IL2. Also, the first connection pattern CNP may be connected to the third drain electrode DE3a/DE3b and the fourth drain electrode DE4a/DE4b through the second contact hole CH2 passing through the first insulating layer GI, the second insulating layer ILL and the third insulating layer IL2.

In some exemplary embodiments, the auxiliary connection pattern AUX may be connected to the initialization power line IPL through the eighth contact hole CH8 passing through the third insulating layer IL2. Also, the auxiliary connection pattern AUX may be connected to the seventh drain electrode DE7 through the ninth contact hole CH9 passing through the first insulating layer GI, the second insulating layer IL1, and the third insulating layer IL2.

In some exemplary embodiments, the bridge pattern BRP may be a pattern provided as a medium connecting the sixth drain electrode DE6 and the first electrode AD between the sixth drain electrode DE6 and the first electrode AD. The bridge pattern BRP may be connected to the sixth drain electrode DE6 and the seventh source electrode SE7 through the seventh contact hole CH7 passing through the first insulating layer GI, the second insulating layer IL', and the third insulating layer IL2.

In some exemplary embodiments, the data line Dj, the power line PL, the first connection pattern CNP, the auxiliary connection pattern AUX, and/or the bridge pattern BRP, which are disposed in the third conductive layer, may include the same material. In an exemplary embodiment, the data line Dj, the power line PL, the first connection pattern CNP, the auxiliary connection pattern AUX, and/or the bridge pattern BRP may include a predetermined source-drain metal. In another exemplary embodiment of the invention, when at least one of the source and drain electrodes (e.g., SE1 to SE7 and DE1 to DE7) is disposed in the third conductive layer, the source and drain electrodes (e.g., SE1 to SE7 and DE1 to DE7) may also include the source-drain metal.

In some exemplary embodiments, the source-drain metal may be one of the metals proposed as examples of the first gate metal and/or the second gate metal, described above, but the invention is not limited thereto. In addition, the material of the data line Dj, the power line PL, the first connection pattern CNP, the auxiliary connection pattern AUX, and/or the bridge pattern BRP, which are disposed in the third conductive layer, is not necessarily limited to the metal. That is, any material capable of providing conductivity to a degree to which the pixels PXL may be smoothly driven may be used as the material of the data line Dj, the power line PL, the first connection pattern CNP, the auxiliary connection pattern AUX, and/or the bridge pattern BRP. In an exemplary embodiment, the data line Dj, the power line PL, the first connection pattern CNP, the auxiliary connection pattern AUX, and/or the bridge pattern BRP may include a conductive polymer or conductive metal oxide.

In some exemplary embodiments, at least two of the first gate metal, the second gate metal, and the source-drain metal may include the same material. In an exemplary embodiment, although the first gate metal and the second gate metal are disposed in layers different from each other, the first gate metal and the second gate metal may include the same material with each other, for example. However, the invention is not limited thereto. In another exemplary embodiment, the first gate metal, the second gate metal, and the source-drain metal may include different materials from each other.

The power line PL is a line in which current flows when the panel 100 emits light, and may include a material having a low resistance so as to prevent degradation of image quality due to a voltage drop (i.e., current-resistance ("IR") drop). In an exemplary embodiment, the source-drain metal is selected by first considering a condition in which its resistivity is low, and may include a material having a lower resistance than that of the first gate metal and/or the second gate metal.

A fourth insulating layer PSV may be provided on the third conductive layer. In some exemplary embodiments, the fourth insulating layer PSV may include a passivation layer and/or a planarization layer.

The OLED may be provided on the fourth insulating layer PSV. The OLED may include the first electrode AD, the second electrode CD, and the emitting layer EML provided between the first and second electrodes AD and CD.

In some exemplary embodiments, the first electrode AD may be provided on the fourth insulating layer PSV. The first electrode AD may be connected to the bridge pattern BRP through the tenth contact hole CH10 passing through the fourth insulating layer PSV. Since the bridge pattern BRP is connected to the sixth drain electrode DE6 and the seventh source electrode SE7 through the seventh contact hole CH7, the first electrode AD may be finally connected to the sixth drain electrode DE6 and the seventh source electrode SE7.

In some exemplary embodiments, a pixel defining layer PDL defining a light emitting region to correspond to each pixel PXL may be provided on the substrate SUB on which the first electrode AD and the like are disposed. The pixel defining layer PDL exposes a top surface of the first electrode AD, and may protrude from the substrate SUB along the circumference of the pixel PXL.

The emitting layer EML may be provided in the light emitting region surrounded by the pixel defining layer PDL, and the second electrode CD may be provided on the emitting layer EML. In some exemplary embodiments, an encapsulation layer SLM covering the second electrode CD may be provided over the second electrode CD.

In some exemplary embodiments, one of the first electrode AD and the second electrode CD may be an anode electrode, and the other of the first electrode AD and the second electrode CD may be a cathode electrode. In an exemplary embodiment, the first electrode AD may be an anode electrode, and the second electrode CD may be a cathode electrode, for example.

The emitting layer EML may be disposed on the exposed surface of the first electrode AD. The emitting layer EML may have a multi-layered thin film structure at least including a light generation layer ("LGL").

In some exemplary embodiments, the color of light generated in the LGL may be one of red, green, blue, and white, but the invention is not limited thereto. In an exemplary embodiment, the color of light generated in the LGL of the light emitting layer EML may also be one of magenta, cyan, and yellow, for example.

In some exemplary embodiments, the encapsulation layer SLM may prevent oxygen and moisture from penetrating into the light emitting diode OLED. To this end, the encapsulation layer SLM may include an inorganic layer. In an exemplary embodiment, the inorganic layer may include at least one of silicon oxide, silicon nitride, silicon oxynitride, aluminum oxide, titanium oxide, zirconium oxide, and tin oxide, for example. The encapsulation layer SLM may be provided to cover at least the display unit 110.

Figure 8:
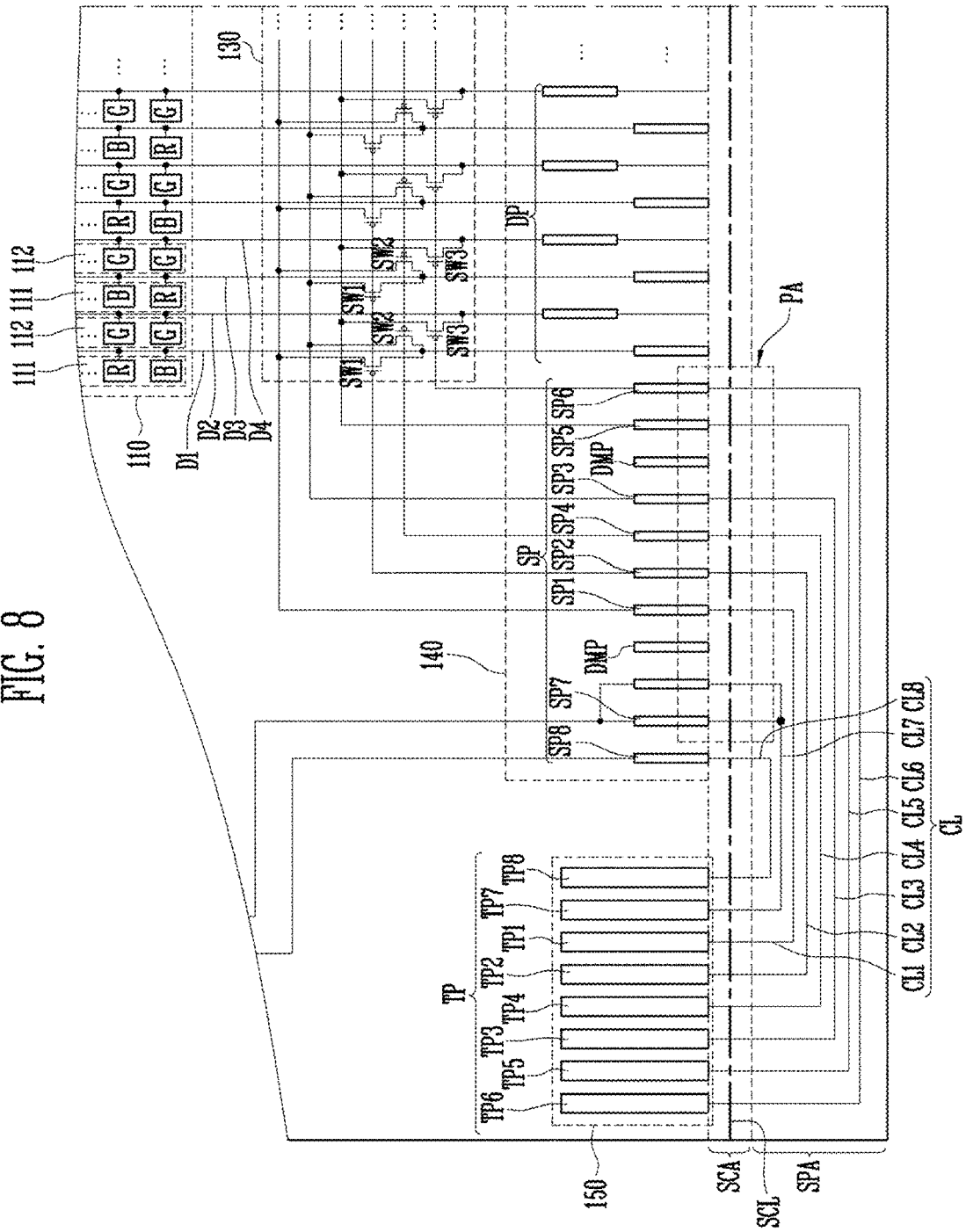
FIGS. 8 and 9 illustrate an exemplary embodiment of a display unit, a test unit, and first and second pad units, which are shown in FIG. 2, and a connection structure therebetween.
Figure 9:
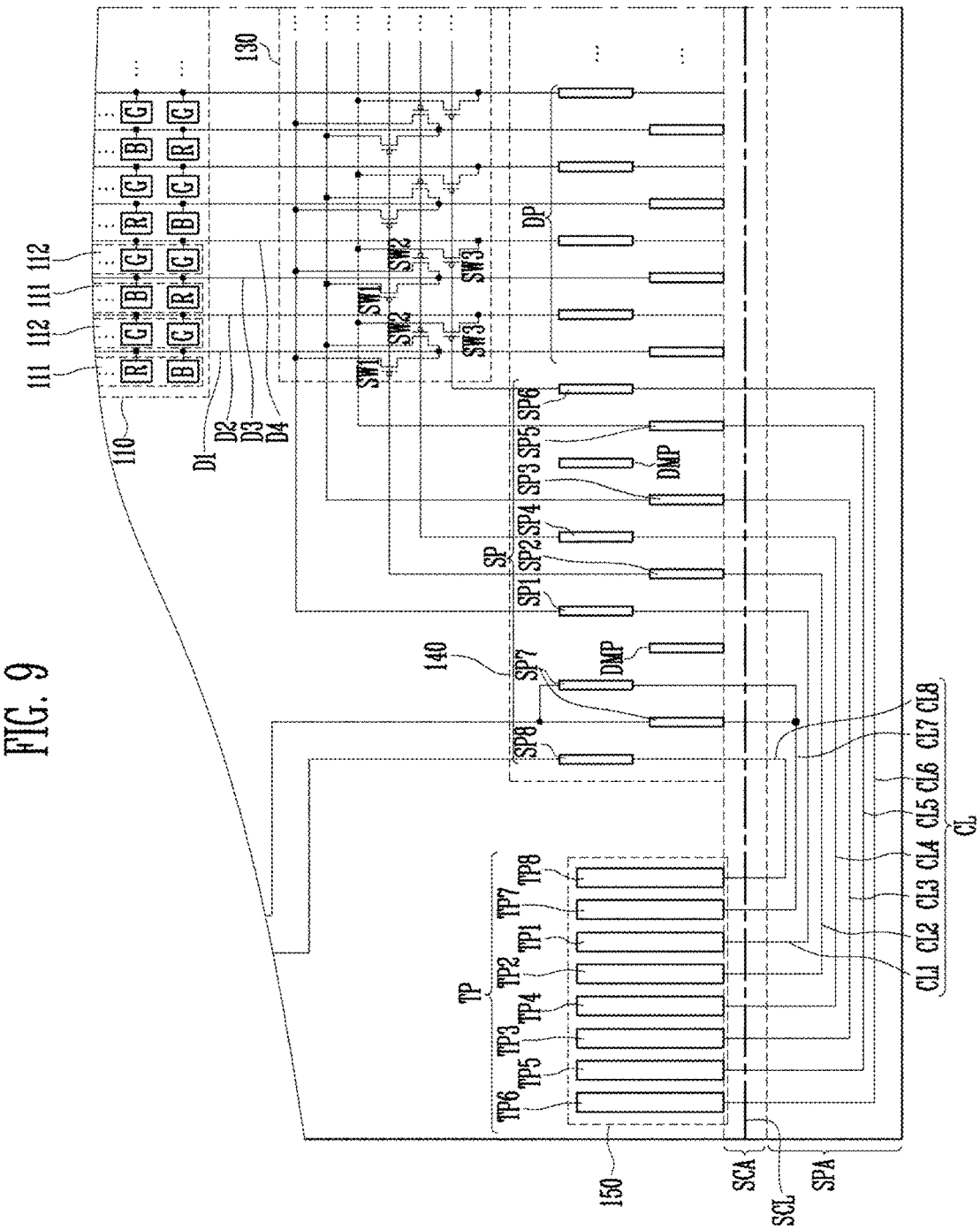

FIGS. 8 and 9 illustrate an exemplary embodiment of the display unit, the test unit, and the first and second pad units, which are shown in FIG. 2, and a connection structure therebetween. Particularly, FIG. 9 illustrates a modified embodiment of a first pad unit shown in FIG. 8. Based on a test unit, an exemplary configuration of pixel columns and first and second pad units, which are connected to the test unit, is illustrated in FIGS. 8 and 9. However, the invention is not limited to the structure shown in FIGS. 8 and 9. In other exemplary embodiments, the kind, number, and/or arrangement structure of pads included in the first and second pad units may be variously modified and embodied, for example. Similarly, the arrangement structure of pixels provided in the display unit is not limited to the exemplary embodiment shown in FIGS. 8 and 9, and may be variously modified and embodied.

Referring to FIGS. 8 and 9, the display unit 110 may include first, second, and third pixels R, B, and G, which emit light of colors different from one another. In some exemplary embodiments, the first pixel R may be a red pixel that emits light of red, and the second pixel B may be a blue pixel that emits light of blue. In addition, the third pixel G may be a green pixel that emits light of green. In some exemplary embodiments, the first pixels R and the second pixel B may be alternately arranged on the same column, and the third pixels G may be arranged in a line on a column adjacent to the column on which the first and second pixels R and B are arranged.

An exemplary embodiment in which red pixels (e.g., the first pixels R) and blue pixels (e.g., the second pixels B) are alternately arranged on the same column, and green pixels (e.g., the third pixels G) are arranged in a line on a column adjacent to the column on which the red pixels and the blue pixels are arranged has been illustrated in FIGS. 8 and 9, but the arrangement structure of the pixels R, G, and B may vary. In another exemplary embodiment, red pixels and green pixels may be alternately arranged on the same column, and blue pixels may be arranged in a line on a column adjacent to the column on which the red pixels and the green pixels are arranged, for example. In addition, an exemplary embodiment in which the first to third pixels R, G, and B are arranged in a matrix form side by side along horizontal and vertical directions has been illustrated in FIGS. 8 and 9, but the invention is not limited thereto. In another exemplary embodiment, pixels on two adjacent columns may be alternately arranged to cross each other, for example.

That is, in an exemplary embodiment of the invention, the display unit 110 may include first pixel columns 111 on which a plurality of pixels (e.g., the first pixels R and the second pixels B) that emit light of colors different from each other are alternately arrange, and second pixel columns 112 on which a plurality of third pixels G that emit light of one different color from the first and second pixels R and B are arranged.

In some exemplary embodiments, based on a column on which the first pixel R, the second pixel B, and the third pixel G are arranged, the first pixels R and the second pixels B may be arranged in a check-board shape such that each of the first pixels R and the second pixels B are located in a diagonal direction. That is, the first pixels R and the second pixels B may be alternately arranged on two adjacent rows such that each of the first pixels R and the second pixels B are not repetitively arranged on the same column. In an exemplary embodiment, the first pixel columns 111 and the second pixel columns 112 may be alternately arranged, and the first and second pixels R and B may be arranged in a check-board shape with reference to the second pixel column 112, for example.

Each of the pixel columns 111 and 112 is connected to a data line D disposed on a corresponding column. In an exemplary embodiment, a first (e.g., leftmost) first pixel column 111 may be connected to a first data line D1, and a first (e.g., leftmost) second pixel column 112 may be connected to the second data line D2, for example.

The test unit 130 includes first and second switching elements SW1 and SW2 connected to data lines (e.g., odd-numbered data lines D2$k$–1 including the first data line D1 where k is a natural number) connected to the respective first pixel columns 111, and a third switching element SW3 connected to data lines (e.g., even-numbered data lines D2$k$ including the second data line D2) connected to the respective second pixel columns 112.

A control electrode (e.g., a gate electrode) of each the first switching elements SW1 is commonly connected to a second signal pad SP2. In addition, a first electrode (e.g., a drain electrode) of the first switching element SW1 is connected to a data line D on a corresponding column, and a second electrode (e.g., a source electrode) of the first switching element SW1 is connected to a first signal pad SP1 or a third signal pad SP3. That is, the first switching element SW1 is connected between the data line D on the corresponding column and the first or third signal pad SP1 or SP3. In an exemplary embodiment, the first switching element SW1 connected to the first first pixel column 111 through the first data line D1 may be connected between the first data line D1 and the first signal pad SP1, for example. In addition, the first switching element SW1 connected to a second first pixel column 111 through a third data line D3 may be connected between the third data line D3 and the third signal pad SP3. Each of the first switching element SW1 is turned on when a first control signal (e.g., a first test gate signal) having a gate-on voltage is supplied from the second signal pad SP2 to transmit a first or second test signal supplied from the first signal pad SP1 or the third signal pad SP3 to a data line D2$k$-1 on the first pixel column 111. In some exemplary embodiments, the first or second test signal may be a predetermined signal for a lighting test, an aging process, and/or a leakage current test. In an exemplary embodiment, the first test signal and the second test signal may be a red lighting signal and a blue lighting signal, respectively, for example.

A control electrode (e.g., a gate electrode) of each of the second switching elements SW2 is commonly connected to a fourth signal pad SP4. In addition, a first electrode (e.g., a drain electrode) of the second switching element SW2 is connected to a data line D2$k$–1 on a corresponding column, and a second electrode (e.g., a source electrode) of the second switching element SW2 is connected to the first signal pad SP1 or the third signal pad SP3. In an exemplary embodiment, the second switching element SW2 connected to the first first pixel column 111 through the first data line D1 may be connected between the first data line D1 and the third signal pad SP3, for example. In addition, the second switching element SW2 connected to the second first pixel column 111 through the third data line D3 may be connected between the third data line D3 and the first signal pad SP1. That is, a pair of first and second switching elements SW1 and SW2 may be connected in parallel while sharing a data line D2$k$–1 of the first pixel column 111 on which the first pixels R and the second pixels B are alternately arranged. Each of the second switching elements SW2 is turned on when a second control signal (e.g., a second test gate signal) having the gate-on voltage is supplied from the fourth signal pad SP4 to transmit the first or second test signal supplied from the first signal pad SP1 or the third signal pad SP3 to the data line D2$k$–1 of the first pixel column 111.

A control electrode (e.g., a gate electrode) of each of the third switching elements SW3 is commonly connected to a sixth signal pad SP6. In addition, a first electrode (e.g., a drain electrode) of the third switching element SW3 is connected to a data line D2$k$ of a corresponding column, and a second electrode (e.g., a source electrode) of the third switching element SW3 is connected to a fifth signal pad SP5. In an exemplary embodiment, the third switching element SW3 connected to the first second pixel column 112 through the second data line D2 may be connected between the second data line D2 and the fifth signal pad SP5, for example. In addition, the third switching element SW3 connected to a second second pixel column 112 may be connected between a fourth data line D4 and the fifth signal pad SP5. Each of the third switching elements SW3 is turned on when a third control signal (e.g., a third test gate signal) having the gate-on voltage is supplied from the sixth signal pad SP6 to transmit a third test signal supplied from the fifth signal pad SP5 to a data line D2$k$ of the second pixel column 112. In some exemplary embodiments, the third test signal may be a predetermined signal for a lighting test, an aging process, and/or a leakage current test. In an exemplary embodiment, the third test signal may be a green lighting signal, for example.

The first pad unit 140 may include data pads DP, the first to sixth signal pads SP1 to SP6, seventh and eighth signal pads SP7 and SP8, and/or at least one dummy pad DMP.

The data pads DP are connected to the data lines D, respectively. In some exemplary embodiments, the data pads DP may be electrically connected to the data driver through a module process.

The first to sixth signal pads SP1 to SP6 are electrically connected to test pads TP1 to TP6 of the second pad unit 150 through connection lines CL1 to CL6, respectively.

The first signal pad SP1 is electrically connected to a first test pad TP1 through a first connection line CL1. The first signal pad SP1 may transmit the first test signal supplied from the first test pad TP1 to some of the first and second switching elements SW1 and SW2 during a period in which a predetermined test is performed. In an exemplary embodiment, the first signal pad SP1 may transmit the first test signal supplied from the first test pad TP1 to the first switching elements SW1 connected to the odd-numbered first pixel columns 111 and the second switching elements SW2 connected to the even-numbered first pixel columns 111 during a period in which a cell test is performed, for example.

The second signal pad SP2 is electrically connected to a second test pad TP2 through a second connection line CL2. The second signal pad SP2 may transmit the first control signal supplied from the second test pad TP2 to the control electrodes of the first switching elements SW1 during a period in which a predetermined test is performed. In an exemplary embodiment, the second signal pad SP2 may transmit the first test gate signal supplied from the second test pad TP2 to the control electrodes of the first switching elements SW1 during the period in which the cell test is performed, for example.

The third signal pad SP3 is electrically connected to a third test pad TP3 through a third connection line CL3. The third signal pad SP3 may transmit the second test signal supplied from the third test pad TP3 to some of the first and second switching elements SW1 and SW2 during a period in which a predetermined test is performed. In an exemplary embodiment, the third signal pad SP3 may transmit the second test signal supplied from the third test pad TP3 to the first switching elements SW1 connected to the even-numbered first pixel columns 111 and the second switching elements SW2 connected to the odd-numbered first pixel columns 111 during the period in which the cell test is performed, for example.

The fourth signal pad SP4 is electrically connected to a fourth test pad TP4 through a fourth connection line CL4. The fourth signal pad SP4 may transmit the second control signal supplied from the fourth test pad TP4 to the control electrodes of the second switching elements SW2 during a period in which a predetermined test is performed. In an exemplary embodiment, the fourth signal pad SP4 may transmit the second test gate signal supplied from the fourth test pad TP4 to the control electrodes of the second switching elements SW2 during the period in which the cell test is performed, for example.

The fifth signal pad SP5 is electrically connected to a fifth test pad TP5 through a fifth connection line CL5. The fifth signal pad SP5 may transmit the third test signal supplied from the fifth test pad TP5 to the third switching elements SW3 during a period in which a predetermined test is performed. In an exemplary embodiment, the fifth signal pad SP5 may transmit the third test signal supplied from the fifth test pad TP5 to the third switching elements SW3 during the period in which the cell test is performed, for example The sixth signal pad SP6 is electrically connected to a sixth test pad TP6 through a sixth connection line CL6. The sixth signal pad SP6 may transmit the third test signal supplied from the sixth test pad TP6 to the control electrodes of the third switching elements SW3 during a period in which a predetermined test is performed. In an exemplary embodiment, the sixth signal pad SP6 may transmit the third test gate signal supplied from the sixth test pad TP6 to the control electrodes of the third switching elements SW3 during the period in which the cell test is performed, for example.

The seventh and eighth signal pads SP7 and SP8 are exemplarily illustrated as signal pads connected to another component of the panel 100 (refer to FIGS. 2 and 3) except for the test unit 130. In an exemplary embodiment, the seventh signal pad SP7 may be electrically connected to the scan driver 120 (refer to FIGS. 2 and 3) to transmit a driving power from a driving power source to the scan driver 120, and the eighth signal pad SP8 may be electrically connected to the scan driver 120 to transmit a predetermined scan control signal to the scan driver 120, for example. In some exemplary embodiments, a signal pad SP, e.g., the seventh signal pad SP7, which provides a predetermined power, may be implemented in a structure in which two pads are connected.

The dummy pad DMP may be located between predetermined signal pads SP. In an exemplary embodiment, when a voltage difference between predetermined signals and/or predetermined power, which are applied to two adjacent signal pads SP among the signal pads SP, is relatively large, the dummy pad DMP may be located between the signal pads SP, for example. In some exemplary embodiments, the dummy pad DMP may be provided to be spaced apart from signal pads SP in the same layer as that of the signal pads SP. As the dummy pad DMP is provided, the electrical stability between the signal pads SP may be ensured, and the occurrence of a defect may be prevented. The position of the dummy pad DMP may be changed, when necessary.

In FIG. 8, the data pads DP, the signal pads SP, and the at least one dummy pad DMP are arbitrarily illustrated and arranged, but the kind, number, size, and/or positions of pads arranged in the first pad unit 140 may be variously changed. In an exemplary embodiment, the signal pads SP and/or the dummy pads DMP may be arranged side by side in a single line (e.g., on one horizontal line) as shown in FIG. 8, or be alternately arranged in double or multiple lines (e.g., on two or more horizontal lines) as shown in FIG. 9, for example. Alternatively, in another exemplary embodiment, the signal pads SP and/or the dummy pads DMP may be implemented in a form in which the signal pads SP and/or the dummy pads DMP are connected to two pads respectively arranged in lines difference from each other.

The second pad unit 150 may include a plurality of test pads TP. In an exemplary embodiment, the second pad unit 150 may include first to eighth test pads TP1 to TP8 electrically connected to the respective first to eighth signal pads SP1 to SP8, for example. Although not shown in FIG. 8, one or more dummy test pads may be provided to the second pad unit 150 in some exemplary embodiments.

The test pads TP are pads in contact with (connected to) probe pins of an external inspection device such as an auto probe device. The test pads TP are applied with various power and/or various signals, which are desired to perform a predetermined test on the panel 100, from the inspection device. In FIG. 8, it has been illustrated that a distance between the data pads DP and the signal pads SP is large for convenience of description. However, actually, the distance between the data pads DP and the signal pads SP may be narrow as compared with the test pads TP. In addition, a size of each of the data pads DP and the signal pads SP may be smaller than that of each of the test pads TP. Therefore, it is difficult to perform a test by allowing probe pins of the auto probe device to be in direct contact with the data pads DP and the signal pads SP.

The test pads TP has a relatively smaller number than that of the pads (data pads DP and signal pads SP) provided in the first pad unit 140, and is less restricted by size and distance. Thus, the second pad unit 150 to be in contact with probe pins of the inspection device is provided in one region of the panel 100, and each of the test pads TP are electrically connected to a predetermined signal pad SP corresponding thereto, so that test signals may be easily applied to the panel 100.

In some exemplary embodiments, the first test pad TP1 may be supplied with a first test signal. The first test signal supplied to the first test pad TP1 is transmitted to the first signal pad SP1.

The second test pad TP2 may be supplied with a first control signal. The first control signal supplied to the second test pad TP2 is transmitted to the second signal pad SP2.

The third test pad TP3 may be supplied with a second test signal. The second test signal supplied to the third test pad TP3 is transmitted to the third signal pad SP3.

The fourth test pad TP4 may be supplied with a second control signal. The second control signal supplied to the fourth test pad TP4 is transmitted to the fourth signal pad SP4.

The fifth test pad TP5 may be supplied with a third test signal. The third test signal supplied to the fifth test pad TP5 is transmitted to the fifth signal pad SP5.

The sixth test pad TP6 may be supplied with a third control signal. The third control signal supplied to the sixth test pad TP6 is transmitted to the sixth signal pad SP6.

The seventh test pad TP7 may be supplied with a predetermined power (e.g., a predetermined scan driving power). The power supplied to the seventh test pad TP7 is transmitted to the seventh signal pad SP7.

The eighth test pad TP8 may be supplied with a predetermined control signal (e.g., a predetermined scan control signal). The control signal supplied to the eighth test pad TP8 is transmitted to the eighth signal pad SP8.

Hereinafter, when assuming that a lighting test of the panel 100 is performed as an example, an exemplary embodiment of an inspecting (or testing) method of the panel 100 using the test unit 130 and the test pads TP will be described.

In order to perform the lighting test, a red lighting signal is supplied to the first test pad TP1, a first test gate signal is supplied to the second test pad TP2, a blue lighting signal is supplied to the third test pad TP3, a second test gate signal is supplied to the fourth test pad TP4, a green lighting signal is supplied to the fifth test pad TP5, a third test gate signal is supplied to the sixth test pad TP6, a predetermined driving power is supplied to the seventh test pad TP7, and a predetermined driving signal is supplied to the eighth test pad TP8. Therefore, the first, second, and third pixels R, B, and G are supplied with first, second, and third test signals from the data lines D, and emit light corresponding thereto. Accordingly, the cell test including the lighting test and the like may be performed.

In some exemplary embodiments, the seventh test pad TP7 may be provided as many as the number of power sources (e.g., a scan driving power source and a pixel power source) desired to drive the panel 100. Similarly, the eighth test pad TP8 may also be provided as many as the number of other driving signals (e.g., scan control signals) desired to drive the panel 100.

In some exemplary embodiments, the red lighting signal, the blue lighting signal, the green lighting signal, and the third test gate signal may be direct current ("DC") signals having a voltage of a constant level. The first test gate signal and the second test gate signal may be alternating current ("AC") signals that alternatively have a gate-on voltage to alternately turn on a pair of first and second switching elements SW1 and SW2 sharing a predetermined data line D. In this case, while the lighting test is being performed, voltages of the red lighting signal and the blue lighting signal are alternately applied to the data lines D2$k$-1 connected to the first pixel columns 111, and a voltage of the green lighting signal is continuously applied to the data lines D2$k$ connected to the second pixel columns 112.

In some exemplary embodiments, the voltages of the red lighting signal, the blue lighting signal, and/or the green lighting signal may be different. In an exemplary embodiment, the voltages of the red lighting signal and the blue lighting signal may be different, for example. Therefore, a large current may flow in the data lines D2$k$-1 connected to the first pixel columns 111 as the voltage of the data lines D2$k$-1 is periodically changed while the lighting test is being performed. Accordingly, a connection part of the first signal pad SP1 and the first connection line CL1, to which the red lighting signal is applied, and a connection part of the third signal pad SP3 and the third connection line CL3, to which the blue lighting signal is applied, may be weak to a burnt defect. As a burnt defect occurs at a lead-in part provided at one end of the first signal pad SP1 and/or a lead-in part provided at one end of the third signal pad SP3, a magenta defect may be caused, for example. Accordingly, in an exemplary embodiment of the invention, which will be described later, there is proposed a structure that enables test signals to be stably applied to the panel 100 of the organic light emitting display device, which includes the test unit 130 for detecting a defect of the display unit 110 at an early stage.

Figure 10:
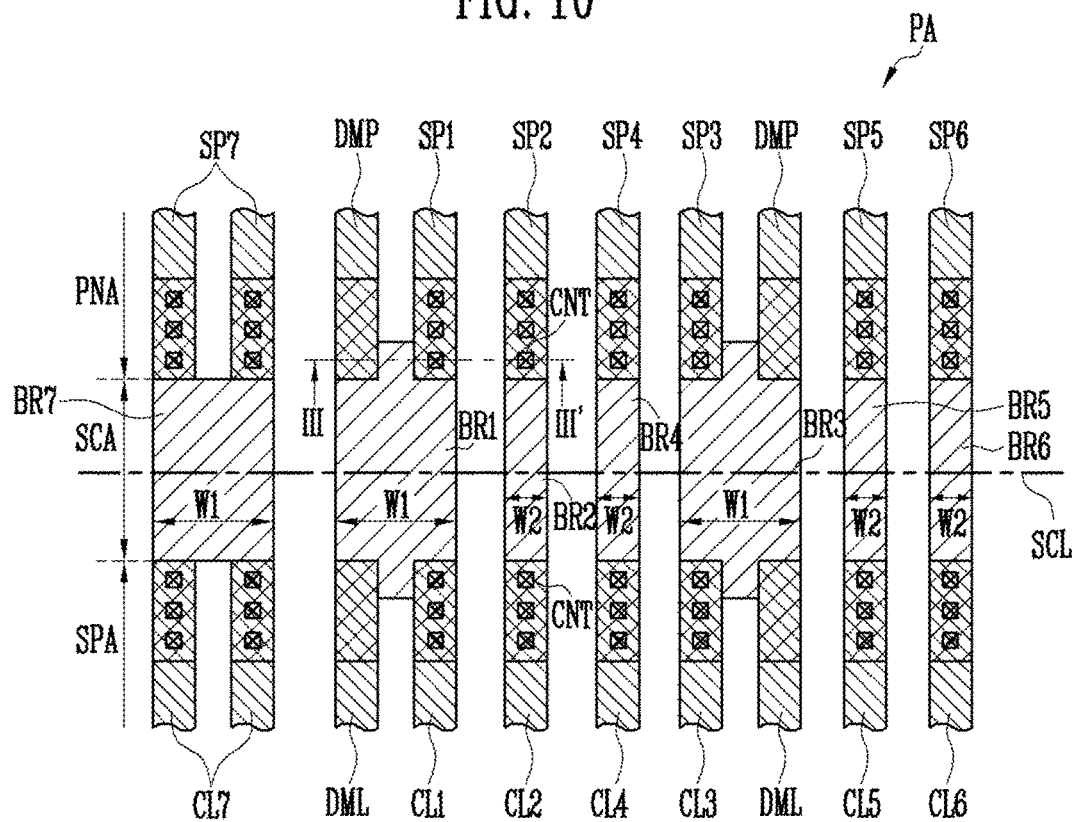
FIGS. 10 and 11 illustrate an exemplary embodiment of region PA of FIG. 8.
Figure 11:
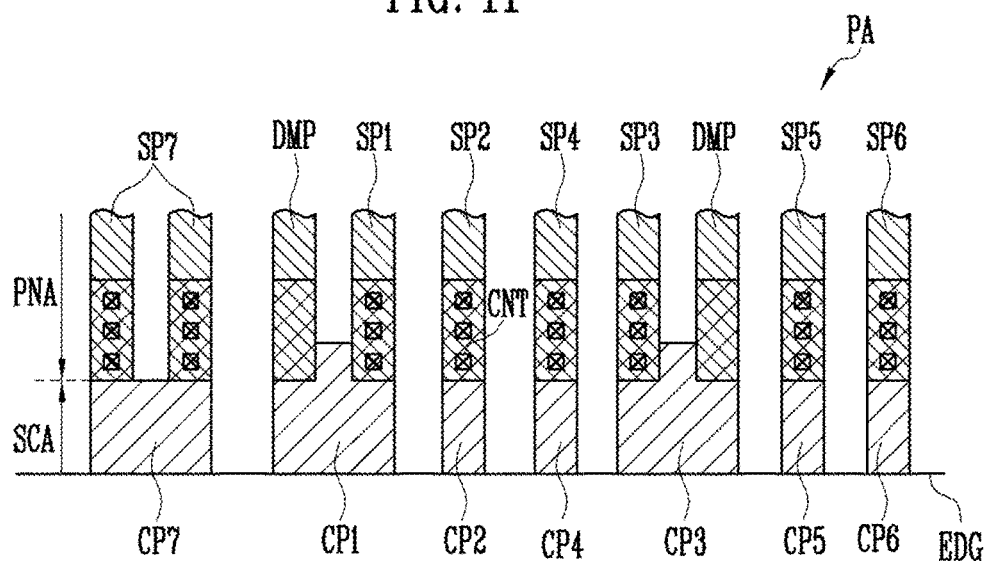
Figure 12:
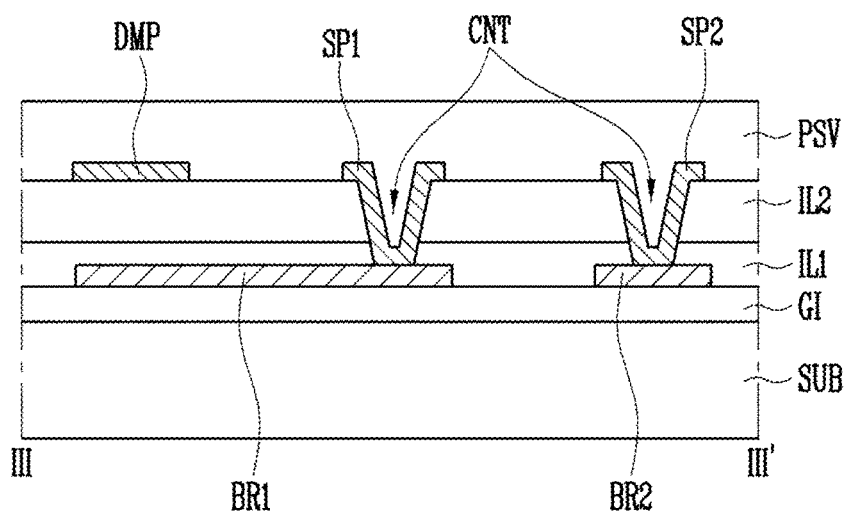
FIG. 12 illustrates an example of a section taken along line III-III' of FIG. 10.

FIGS. 10 and 11 illustrate an exemplary embodiment of region PA of FIG. 8. Particularly, a connection structure between signal pads and connection lines is illustrated. In some exemplary embodiments, FIG. 10 illustrates one region in the vicinity of the scribing line in a state before the separation region under the scribing region is separated, and FIG. 11 illustrates one region remaining at the lower end of the panel in region PA of FIG. 10 after the separation region is separated through at least one-time scribing process. FIG. 12 illustrates an example of a section taken along line of FIG. 10.

Referring to FIGS. 10 to 12, the connection lines CL are connected to the signal pads SP via conductive bridges (e.g., BR1 to BR7), respectively. In an exemplary embodiment, the first to seventh connection lines CL1 to CL7 may be electrically connected to the first to seventh signal pads SP1 to SP7 via first to seventh bridges BR1 to BR7, respectively, for example. In addition, although not shown in FIGS. 10 to 12, the eighth connection line CL8 shown in FIG. 8 may also be electrically connected to the eighth signal pad SP8 via an eighth bridge (not shown).

In some exemplary embodiments, the bridges (e.g., BR1 to BR7) may be provided in the scribing region SCA. That is, the connection lines CL and the signal pads SP corresponding thereto may be electrically connected through the bridges (e.g., BR1 to BR7) provided in the scribing region SCA, respectively. In an exemplary embodiment, the first connection line CL1 and the first signal pad SP1 may be electrically connected to each other through the first bridge BR1, the second connection line CL2 and the second signal pad SP2 may be electrically connected to each other through the second bridge BR2, the third connection line CL3 and the third signal pad SP3 may be electrically connected to each other through the third bridge BR3, the fourth connection line CL4 and the fourth signal pad SP4 may be electrically connected to each other through the fourth bridge BR4, the fifth connection line CL5 and the fifth signal pad SP5 may be electrically connected to each other through the fifth bridge BR5, the sixth connection line CL6 and the sixth signal pad SP6 may be electrically connected to each other through the sixth bridge BR6, the seventh connection line CL7 and the seventh signal pad SP7 may be electrically connected to each other through the seventh bridge BR7, and the eighth connection line CL8 and the eighth signal pad SP8 may be electrically connected to each other through the eighth bridge (not shown), for example.

The bridges (e.g., BR1 to BR7) are disposed on a different layer from that of the connection lines CL and the signal pads SP, to be each connected to a predetermined connection line CL and a predetermined signal pad SP through at least one contact hole CNT. In an exemplary embodiment, each of the bridges (e.g., BR1 to BR7) may be physically and/or electrically connected to a predetermined connection line CL and a predetermined signal pad SP through a plurality of contact holes CNT, for example.

In some exemplary embodiments, in an operation of forming a predetermined circuit element of the first, second, and/or third pixels R, B, and/or G, the signal pads SP, the connection lines CL, and the bridges (e.g., BR1 to BR7) may include the same material on the same layer as that of the circuit element. In an exemplary embodiment, when the first, second, and/or third pixels R, B, and/or G. are included in the pixels PXL shown in FIGS. 4 to 7, the signal pads SP, the connection lines CL, and the bridges (e.g., BR1 to BR7) may be provided in a first conductive layer (first gate layer), a second conductive layer (second gate layer), and/or a third conductive layer (source-drain layer), and include the first gate metal, the second gate metal, and/or the source-drain metal. In some exemplary embodiments, the connection lines CL and the bridges (e.g., BR1 to BR7) may include different materials on different layers by reflecting characteristics necessary for each region, for example.

In some exemplary embodiments, the connection lines CL may include a material having a relatively low resistance among the first gate metal, the second gate metal, and the source-drain metal. In an exemplary embodiment, when the source-drain metal includes a material having a lower resistance than that of the first and second gate metals, the connection lines CL may be provided together with the source-drain pattern, i.e., the data line Dj (refer to FIGS. 4 and 5), the power line PL, the first connection pattern CNP, the auxiliary connection pattern AUX, and/or the bridge pattern BRP on the third conductive layer (e.g., the source-drain layer) of the substrate SUB, and include the source-drain metal. In some exemplary embodiments, the connection lines CL and the source-drain pattern may be provided to be spaced apart from each other on the third conductive layer, for example. In an exemplary embodiment, the source-drain pattern may be provided at the inside of the display unit 110 or in the vicinity of the display unit 110, and the connection lines CL may be provided at the outside (e.g., the separation region SPA) of the display unit 110, for example.

In some exemplary embodiments, like the connection lines CL, the signal pads SP may also include a material having a low resistance, e.g., the source-drain metal, to be provided in the third conductive layer on the substrate SUB. The signal pads SP are provided on the third conductive layer to be spaced apart from each other. As the connection lines CL and the signal pads SP have a low resistance, it is possible to prevent or reduce a signal delay while a predetermined test is being performed on the panel 100.

Dummy pads DMP provided between predetermined signal pads SP may also include the same material as that of the signal pads SP and be in the same layer as that of the signal pads SP in an operation of forming the signal pads SP. In an exemplary embodiment, the dummy pads DMP may be provided in the third conductive layer to be spaced part from the signal pads SP, and include the source-drain metal, for example.

When a scribing process is performed in the scribing region SCA, the bridges (e.g., BR1 to BR7) may be cut on the scribing line SCL or in the vicinity of the scribing line. Therefore, as shown in FIG. 11, one ends of the bridges (e.g., BR1 to BR7) are located at an edge EDG of the panel 100 on which the scribing process has been completely performed. The edge EDG may be a region into which moisture and the like easily penetrate. In some exemplary embodiments, the fourth insulating layer PSV may be partially removed in at least one region of the scribing region SCA. Therefore, in an exemplary embodiment of the invention, the bridges (e.g., BR1 to BR7) may include a higher corrosion resistance than that of the signal pads SP and/or the connection lines CL. In an exemplary embodiment, when the first gate metal includes a material having a higher corrosion resistance than that of the source-drain metal, the bridges (e.g., BR1 to BR7) may be provided in the first conductive layer (e.g., the first gate layer) on the substrate SUB, together with gate electrodes (e.g., GE1 to GE7 in FIG. 5) of transistors included in the pixels PXL including red, green and blue pixels R, G, and B, and include the first gate metal, for example. In some exemplary embodiments, the first conductive layer may be a layer separated from the second and third layers with at least one insulating layer interposed therebetween. In an exemplary embodiment, the second and third insulating layers IL1 and IL2 may be interposed between the first conductive layer and the third conductive layer, for example. The bridges (e.g., BR1 to BR7) are provided on the first conductive layer to be spaced apart from each other.

When the bridges (e.g., BR1 to BR7) are cut through the scribing process, a lower end region (e.g., one region adjacent to the separation region SPA based on the scribing line SCL) of the bridges (e.g., BR1 to BR7) and the separation region SPA are separated from the panel 100. In addition, an upper end region (e.g., one region adjacent to the panel region PNA based on the scribing line SCL) of the bridges (e.g., BR1 to BR7) remains at the edge EDG of the panel 100.

Accordingly, the bridges (e.g., BR1 to BR7) remain in the form of conductive patterns (e.g., CP1 to CP7) physically and/or electrically connected to one end of a corresponding signal pad SP through contact connection on the panel 100 that has been completely manufactured. In an exemplary embodiment, the first bridge BR1 cut through the scribing process remains as a first conductive pattern CP1 connected to one end of the first signal pad SP1, and the second bridge BR2 cut through the scribing process remains as a second conductive pattern CP2 connected to one end of the second signal pad SP2, for example. In some exemplary embodiments, one ends of the first and second conductive patterns CP1 and CP2, as shown in FIG. 11, may be floated on the edge EDG of the panel 100. Similarly, the other bridges (e.g., BR3 to BR7) remain as conductive patterns (e.g., CP3 to CP7) connected to one ends of the other signal pads SP, respectively.

In some exemplary embodiments, some of the signal pads SP may have a different connection structure from the other signal pads between the signal pads SP and the connection lines CL corresponding thereto. In an exemplary embodiment, the seventh signal pad SP7 supplied with a predetermined power may have a dual pad structure, and the seventh bridge BR7 may have a wide width to simultaneously connect two seventh signal pads SP7 to the seventh connection line CL7 (e.g., the seventh connection line CL7 branching off into two parts), for example. In some exemplary embodiments, the seventh bridge BR7 may have a wider width than that of the second bridge BR2 located on a supply path of the first control signal. In an exemplary embodiment, the seventh bridge BR7 may have a first width W1, and the second bridge BR2 may have a second width W2 narrower than that of the first width W1, for example.

In some exemplary embodiments, at least one of the first to sixth signal pads SP1 to SP6 for supplying a predetermined test signal and/or a predetermined control signal to the test unit 130 may have a different connection structure from the other signal pads between the signal pads and a connection line (at least one of CL1 to CL6) corresponding thereto. In an exemplary embodiment, the first and third bridges BR1 and BR3 for respectively transmitting the first and second test signals to the first and third signal pads SP1 and SP3 may include the same material as that of the second and fourth to sixth bridges BR2 and BR4 to BR6, and be manufactured to have a lower resistance than that of the second and fourth to sixth bridges BR2 and BR4 to BR6, for example.

In an exemplary embodiment of the invention, as the first and third bridges BR1 and BR3 have a larger area than that of the second and fourth to sixth bridges BR2 and BR4 to BR6, the first and third bridges BR1 and BR3 may have a lower resistance than that of the second and fourth to sixth bridges BR2 and BR4 to BR6. In an exemplary embodiment, the first to sixth bridges BR1 to BR6 may have the substantially same length, and the first and third bridges BR1 and BR3 may have a wider (or greater) width than that of the second, fourth, fifth, and sixth bridges BR2, BR4, BR5, and BR6, for example. Therefore, each of the first and third bridges BR1 and BR3 may have a lower resistance than each of the second, fourth, fifth, and sixth bridges BR2, BR4, BR5, and BR6.

In an exemplary embodiment, when one or more dummy pads DMP are provided in the vicinity of each of the first and third signal pads SP1 and SP3 to be adjacent to each of the first and third signal pads SP1 and SP3, the width of each of the first and third bridges BR1 and BR3 may extend such that each of the first and third bridges BR1 and BR3 overlaps with at least one region of the dummy pad DMP adjacent thereto, for example. In some exemplary embodiments, when a dummy line DML is provided in the vicinity of the first and third bridges BR1 and BR3 even in the separation region SPA adjacent to the scribing region SCA, the width of each of the first and third bridges BR1 and BR3 may extend such that each of the first and third bridges BR1 and BR3 overlaps with at least one region of the dummy line DML adjacent thereto.

In an exemplary embodiment, the first and third bridges BR1 and BR3 may have a first width W1 like the seventh signal pad SP7, and the second, fourth, fifth, and sixth bridges BR2, BR4, BR5, and BR6 may have a second width W2 narrower than that of the first width W1, for example. In this case, in the panel 100 on which the scribing process has been completely performed, the first and third conductive patterns CP1 and CP3 remain in a form in which the first and third conductive patterns CP1 and CP3 have a greater width and area than that of the second, fourth, fifth, and sixth conductive patterns CP2, CP4, CP5, and CP6.

In some exemplary embodiments, each of the first and third bridges BR1 and BR3 may be insulated from an adjacent dummy pad DMP and/or an adjacent dummy line DML. In an exemplary embodiment, the dummy pad DMP and the dummy line DML may be provided on the third conductive layer, and the first and third bridges BR1 and BR3 may overlap with an adjacent dummy pad DMP and an adjacent dummy line DML with at least one insulating layer, e.g., the second and third insulating layers IL1 and IL2, interposed therebetween, to be physically and/or electrically separated from the dummy pad DMP and the dummy line DML, for example. Accordingly, the dummy pad DMP is disposed to be insulated from two adjacent signal pads SP, particularly, two signal pads SP applied with signals having a relatively large voltage difference between the signal pads SP, thereby ensuring electrical stability (insulation) between the signal pads SP. In addition, the dummy line DML enables electrical stability to be ensured between two adjacent connection lines CL.

As described above, according to the exemplary embodiment of the invention, the connection lines CL includes a material having a relatively low resistance when the signal pads SP and the test pads TP are electrically connected to each other. Accordingly, a signal delay may be reduced or prevented, and a predetermined test on the panel 100 may be smoothly performed. The scribing region SCA is weak to corrosion as a line or pattern passing through the scribing line SCL is disconnected through the scribing process. Thus, in the scribing region SCA, bridges (e.g., BR1 to BR7) are formed by selecting a material having a relatively high corrosion resistance, and the signal pads SP of the panel region PNA and the connection lines CL of the separation region SPA are electrically connected by the bridges (e.g., BR1 to BR7).

The bridges (e.g., BR1 to BR7) include a material selected by considering the corrosion resistance, and may include a material having a higher resistance than that of the signal pads SP and the connection lines CL. Therefore, a region passing through the bridges (e.g., BR1 to BR7) among connection parts between the signal pads SP and the test pads TP may be relatively weak to a burnt defect, etc. Particularly, the first and third signal pads SP1 and SP3 and a peripheral part thereof may be weak to the burnt defect for the reason described in FIGS. 8 and 9.

Thus, in the exemplary embodiment of the invention, the width of each of the first and third bridges BR1 and BR3 extends such that each of the first and third bridges BR1 and BR3 overlaps with an adjacent dummy pad DMP and/or an adjacent dummy line DML, thereby decreasing the resistance of each of the first and third bridges BR1 and BR3. Accordingly, it is possible to effectively prevent a burnt defect that may occur during a test period.

That is, according to the exemplary embodiment of the invention, it is possible to provide an organic light emitting display device that includes the test unit 130 for detecting a defect of the display unit 110 at an early stage and enables test signals to be stably supplied thereto.

Figure 13:
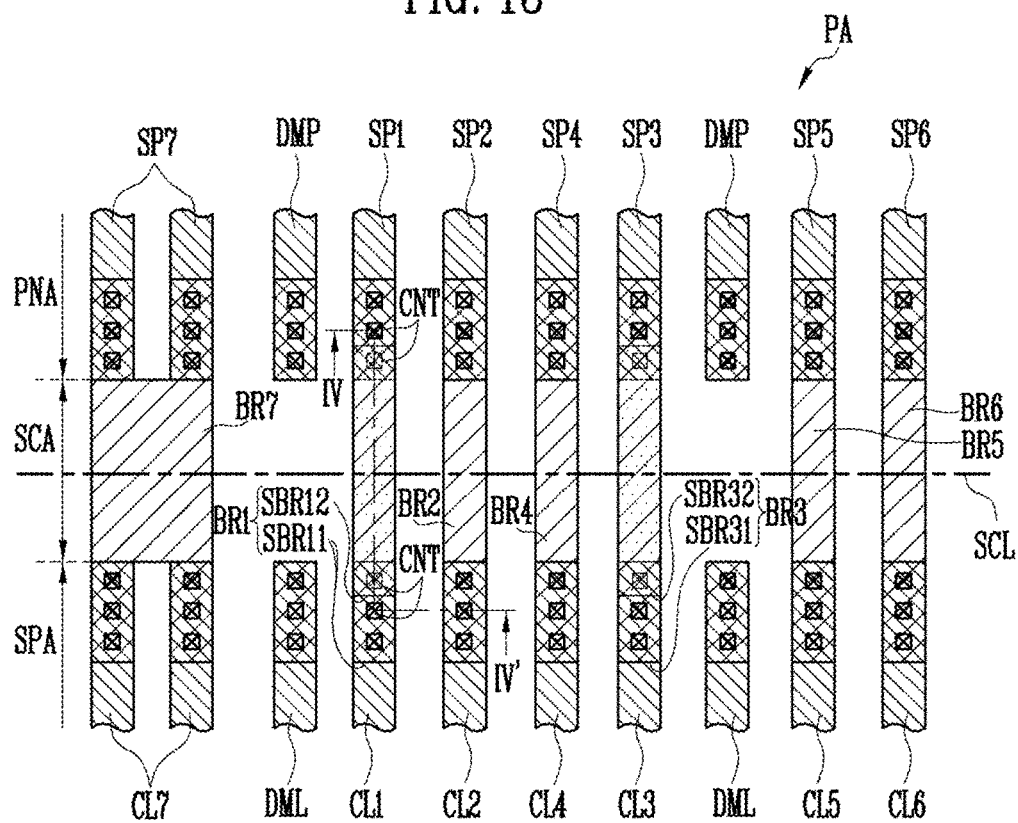
FIGS. 13 and 14 illustrate another exemplary embodiment of the region PA of FIG. 8.
Figure 14:
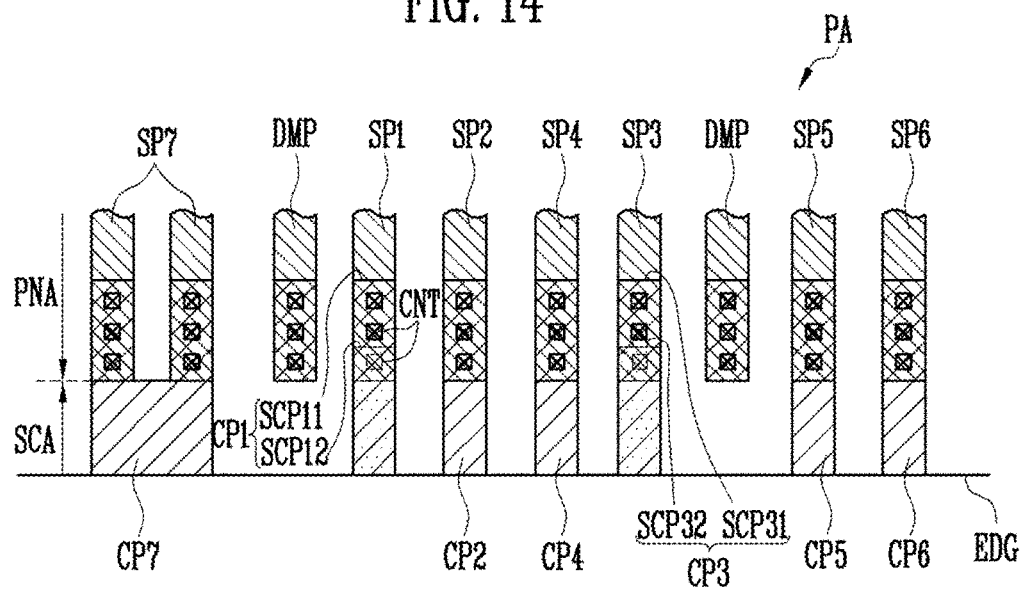
Figure 15:
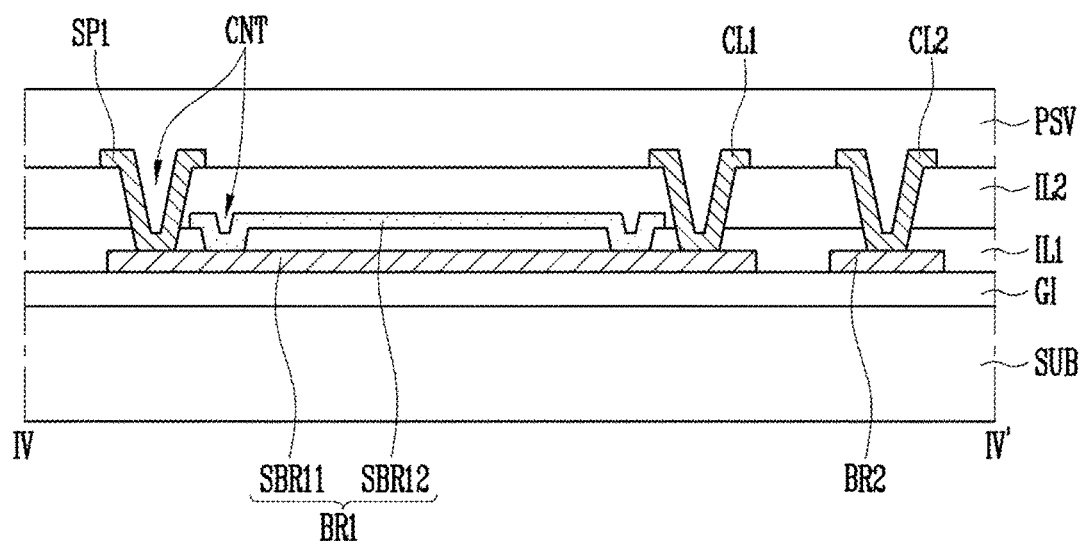
FIG. 15 illustrates an example of a section taken along line IV-IV' of FIG. 13.

FIGS. 13 and 14 illustrate another exemplary embodiment of the region PA of FIG. 8. Particularly, a connection structure between signal pads and connection lines is illustrated. FIG. 15 illustrates an example of a section taken along line IV-IV' of FIG. 13. In FIGS. 13 to 15, components similar or identical to those of FIGS. 10 to 12 are designated by like reference numerals, and their detailed descriptions will be omitted.

Referring to FIGS. 13 to 15, each of the first and third bridges BR1 and BR3 has a multi-layer structure including a plurality of sub-bridges (e.g., SBR11 to SBR32) disposed in different layers. In an exemplary embodiment, the first bridge BR1 may include a first sub-bridge SBR11 provided on the first conductive layer (first gate layer), together with the second, fourth, fifth, and sixth bridges BR2, BR4, BR5, and BR6, and a second sub-bridge SBR12 provided on the second conductive layer (second gate layer) between the first conductive layer and the third conductive layer (source-drain layer), for example. In addition, the third bridge BR3 may also include a first sub-bridge SBR31 provided on the first conductive layer, together with the second, fourth, fifth, and sixth bridges BR2, BR4, BR5, and BR6, and a second sub-bridge SBR32 provided on the second conductive layer. In an exemplary embodiment, the first sub-bridge SBR11 or SBR31 may include the first gate metal, like the lower electrode LE of the storage capacitor Cst shown in FIGS. 4 to 7, to be provided on the first conductive layer (first gate layer), and the second sub-bridge SBR12 or SBR32 may include the second gate metal, like the upper electrode UE of the storage capacitor Cst, to be provided on the second conductive layer (second gate layer), for example.

When the bridges (e.g., BR1 to BR7) are cut through the scribing process, a lower end region (e.g., one region adjacent to the separation region SPA based on the scribing line SCL) of the bridges (e.g., BR1 to BR7) and the separation region SPA are separated from the panel 100. In addition, an upper end region (e.g., one region adjacent to the panel region PNA based on the scribing line SCL) of the bridges (e.g., BR1 to BR7) remains at the edge EDG of the panel 100.

Accordingly, the bridges (e.g., BR1 to BR7) are provided on a layer (e.g., the first conductive layer and/or the second conductive layer) different from a layer (e.g., the third conductive layer) in which the signal pads SP are provided on the panel 100 that has been completely manufactured, and remain in the form of conductive patterns (e.g., CP1 to CP7) physically and/or electrically connected to one end of a corresponding signal pad SP through contact connection. In an exemplary embodiment, the first and third bridges BR1 and BR3 cut through the scribing process may remain in the forms of the first and third conductive patterns CP1 and CP3 connected to one ends of the first and third signal pads SP1 and SP3, respectively, for example. In this case, the first sub-bridges SBR11 and SBR31 may remain as first sub-conductive patterns SCP11 and SCP31 connected to one ends of the first and third signal pads SP1 and SP3, respectively, and the second sub-bridges SBR12 and SBR32 may remain as second sub-conductive patterns SCP12 and SCP32 that are provided on different layers from the first sub-conductive patterns SCP11 and SCP31 and connected to the first sub-conductive patterns SCP11 and SCP31, respectively. That is, in some exemplary embodiments, the first and third conductive patterns CP1 and CP3 may have multi-layer structures including the first sub-conductive patterns SCP11 and SCP31 and the second sub-conductive patterns SCP12 and SCP32, respectively. In some exemplary embodiments, each of the second, fourth, fifth, and sixth conductive patterns CP2, CP4, CP5, and CP6 may have a single-layer structure. In an exemplary embodiment, each of the second, fourth, fifth, and sixth conductive patterns CP2, CP4, CP5, and CP6 may be disposed in a single conductive layer provided in the first conductive layer, together with the first sub-conductive patterns SCP11 and SCP31, for example.

In some exemplary embodiments, a width of the first and third bridges BR1 and BR3 (or the first and third conductive patterns CP1 and CP3) may be substantially equal or similar to that of the second, fourth, fifth, and sixth bridges BR2, BR4, BR5, and BR6 (or the second, fourth, fifth, and sixth conductive patterns CP2, CP4, CP5, and CP6). In an exemplary embodiment, at least one of the sub-bridges (e.g., SBR11 to SBR32) of the first and third bridges BR1 and BR3 may have the same width as the second, fourth, fifth, and sixth bridges BR1, BR4, BR5, and BR6, for example. However, the invention is not limited thereto, and the width of the sub-bridges (e.g., SBR11 to SBR32) may be variously modified and embodied.

In the exemplary embodiment shown in FIGS. 13 to 15, a total area of each of the first and third bridges BR1 and BR3 (or the first and third conductive patterns CP1 and CP3) may be larger than that of each of the second, fourth, fifth, and sixth bridges BR2, BR4, BR5, and BR6 (or the second, fourth, fifth, and sixth conductive patterns CP2, CP4, CP5, and CP6). In an exemplary embodiment, the first sub-bridge SBR11 included in the first bridge BR1 and the first sub-bridge SBR31 included in the third bridge BR3 may have the substantially same shape and area as those of the second, fourth, fifth, and sixth bridges BR2, BR4, BR5, and BR6. In this case, each of the first bridge BR1 and the third bridge BR3 may have an area larger than that of each of the second, fourth, fifth, and sixth bridges BR2, BR4, BR5, and BR6 by an area corresponding to the second sub-bridge SBR12 or SBR32 of each of the first bridge BR1 and the third bridge BR3, for example. Accordingly, in the panel 100 on which the scribing process has been completely performed, each of the first and third conductive patterns CP1 and CP3 may have a lower resistance than that of the second, fourth, fifth, and sixth conductive patterns CP2, CP4, CP5, and CP6 while having an area larger than that of each of the second, fourth, fifth, and sixth conductive patterns CP2, CP4, CP5, and CP6.

As described above, in the exemplary embodiment of the invention, the first and third bridges BR1 and BR3 are provided in a multi-layer structure, so that resistances of the first and third bridge patterns BR1 and BR3 are lowered. Accordingly, a burnt defect that may occur during a test period may be effectively prevented, and test signals may be stably supplied to the panel 100 during the test period.

According to the invention, it is possible to provide an organic light emitting display device that includes a test unit and enables a test signal to be stably supplied thereto.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. An organic light emitting display device comprising:
a display unit including a first pixel column and a first data line connected to the first pixel column;
a first pad unit including a first signal pad and a second signal pad, wherein the first pad unit further includes third, fourth, fifth, and sixth signal pads provided in the same layer as that of the first and second signal pads;
a test unit including a first switching element which is connected between the first data line and the first signal pad, and includes a control electrode connected to the second signal pad;
a first conductive pattern provided in a different layer from that of the first signal pad to be connected to one end of the first signal pad;
a second conductive pattern provided in a different layer from that of the second signal pad to be connected to one end of the second signal pad; and
third, fourth, fifth, and sixth conductive patterns respectively connected to one ends of the third, fourth, fifth, and sixth signal pads, the third, fourth, fifth, and sixth conductive patterns being provided in the same layer as that of the first and second conductive patterns,
wherein a width of each of the first and third conductive patterns is greater than that of each of the second, fourth, fifth, and sixth conductive patterns,
wherein the first conductive pattern and the second conductive pattern are spaced apart from each other in the same layer in a width direction defining the first and second conductive patterns, and a width of the first conductive pattern is greater than that of the second conductive pattern along a same line extending in the width direction,
wherein the first pixel column includes:
a plurality of first color pixels that emit light of a first color; and
a plurality of second color pixels that emit light of a second color,
wherein the plurality of first color pixels and the plurality of second color pixels are alternately arranged,
wherein the display unit further includes:
a second pixel column adjacent to the first pixel column, and including a plurality of third color pixels that emit light of a third color; and
a second data line connected to the second pixel column,
wherein the test unit further includes:
a second switching element connected between the first data line and the third signal pad, the second switching element including a control electrode connected to the fourth signal pad; and
a third switching element connected between the second data line and the fifth signal pad, the third switching element including a control electrode connected to the sixth signal pad.

2. The organic light emitting display device of claim 1, further comprising a dummy pad adjacent to the first signal pad in the width direction defining the first and second conductive patterns and in the same layer as that of the first signal pad,
wherein at least one region of the dummy pad overlaps with the first conductive pattern.

3. The organic light emitting display device of claim 2, further comprising at least one insulating layer interposed between the dummy pad and the first conductive pattern,
wherein the dummy pad is insulated from the first conductive pattern.

4. The organic light emitting display device of claim 1, wherein the first pixel column includes a plurality of pixels each including at least one transistor,
wherein the at least one transistor each includes:
an active pattern provided on a substrate;
source and drain electrodes connected to the active pattern; and
a gate electrode overlapping with the active pattern with a first insulating layer interposed therebetween, the gate electrode being provided in the same layer as that of the first and second conductive patterns.

5. The organic light emitting display device of claim 4, further comprising a source-drain pattern connected to at least one of the source and drain electrodes, the source-drain pattern being provided in the same layer as that of the first and second signal pads.

6. The organic light emitting display device of claim 1, wherein the first and second signal pads include the same material with each other, and the first and second conductive patterns include the same material with each other.

7. The organic light emitting display device of claim 1, wherein the first and second conductive patterns include a different material from that of the first and second signal pads, and include a material having a higher corrosion resistance than that of the first and second signal pads.

8. The organic light emitting display device of claim 1, further comprising a second pad unit including a plurality of electrically isolated pads that are provided in a vicinity of the first pad unit.

9. An organic light emitting display device comprising:
a display unit including a first pixel column and a first data line connected to the first pixel column;
a first pad unit including a first signal pad and a second signal pad, wherein the first pad unit further includes third, fourth, fifth, and sixth signal pads provided in the same layer as that of the first and second signal pads;
third, fourth, fifth, and sixth conductive patterns respectively connected to one ends of the third, fourth, fifth, and sixth signal pads,
a test unit including a first switching element which is connected between the first data line and the first signal pad, and includes a control electrode connected to the second signal pad;
a first conductive pattern provided in a different layer from that of the first signal pad to be connected to one end of the first signal pad;
a second conductive pattern provided in a different layer from that of the second signal pad to be connected to one end of the second signal pad;

a second pixel column being adjacent to the first pixel column, the second pixel column including a plurality of third color pixels that emit light of a third color; and
a second data line connected to the second pixel column,
wherein the first conductive pattern and the second conductive pattern have different structures from each other, and
wherein the first conductive pattern has a multi-layer structure including:
  a first sub-conductive pattern provided in the same layer as that of the second conductive pattern;
  a second sub-conductive pattern provided in a different layer from that of the first sub-conductive pattern to be connected to the first sub-conductive pattern, and
  both the first sub-conductive pattern and the second sub-conductive pattern are electrically conductive between terminal ends defining an entire length defining each of the first sub-conductive pattern and the second sub-conductive pattern,
wherein the first pixel column includes:
a plurality of first color pixels that emit light of a first color; and
a plurality of second color pixels that emit light of a second color,
wherein the plurality of first color pixels and the plurality of second color pixels are alternately arranged,
wherein the test unit further includes:
a second switching element connected between the first data line and the third signal pad, the second switching element including a control electrode connected to the fourth signal pad; and
a third switching element connected between the second data line and the fifth signal pad, the third switching element including a control electrode connected to the sixth signal pad,
wherein the first and third conductive patterns have the same structure with each other, and the second, fourth, fifth and sixth conductive patterns have the same structure with one another and have a different structure from that of the first and third conductive patterns.

10. The organic light emitting display device of claim 9, wherein the first pixel column includes a plurality of pixels each including at least one transistor and a capacitor,
wherein the capacitor includes:
  a first electrode provided in the same layer as that of the first sub-conductive pattern; and
  a second electrode provided in the same layer as that of the second sub-conductive pattern.

11. The organic light emitting display device of claim 10, wherein the at least one transistor each includes:
an active pattern provided on a substrate;
source and drain electrodes connected to the active pattern; and
a gate electrode overlapping with the active pattern with a first insulating layer interposed therebetween, the gate electrode being provided in the same layer as that of the first sub-conductive pattern.

12. The organic light emitting display device of claim 11, further comprising a source-drain pattern connected to at least one of the source and drain electrodes, the source-drain pattern being provided in the same layer as that of the first and second signal pads.

13. The organic light emitting display device of claim 9, wherein the second conductive pattern has a single-layer structure including one conductive layer provided in the same layer as that of the first sub-conductive pattern.

14. The organic light emitting display device of claim 9, wherein the first and second conductive patterns include a different material from that of the first and second signal pads, and include a material having a higher corrosion resistance than that of the first and second signal pads.

15. The organic light emitting display device of claim 9, wherein the first and third conductive patterns have a multi-layer structure, and the second, fourth, fifth, and sixth conductive patterns have a single-layer structure.

16. The organic light emitting display device of claim 9, further comprising a second pad unit including a plurality of electrically isolated pads that are provided in a vicinity of the first pad unit.

\* \* \* \* \*